US008837562B1

United States Patent
Betts et al.

(10) Patent No.: US 8,837,562 B1
(45) Date of Patent: Sep. 16, 2014

(54) DIFFERENTIAL SERIAL INTERFACE FOR SUPPORTING A PLURALITY OF DIFFERENTIAL SERIAL INTERFACE STANDARDS

(71) Applicant: Teradici Corporation, Burnaby (CA)

(72) Inventors: Kevin Howard Betts, Port Coquitlam (CA); Victor Lee, Port Coquitlam (CA); Herman Hok Man Leung, Burnaby (CA)

(73) Assignee: Teradici Corporation, Burnaby, British Columbia (CA)

( * ) Notice: Subject to any disclaimer, the term of this patent is extended or adjusted under 35 U.S.C. 154(b) by 0 days.

(21) Appl. No.: 14/103,474

(22) Filed: Dec. 11, 2013

Related U.S. Application Data

(63) Continuation of application No. 13/595,646, filed on Aug. 27, 2012, now Pat. No. 8,638,838.

(51) Int. Cl.
*H04B 1/38* (2006.01)
*H04L 5/16* (2006.01)
*H03K 5/00* (2006.01)

(52) U.S. Cl.
CPC .................................. *H03K 5/00006* (2013.01)
USPC ............................. 375/219; 375/222; 375/295

(58) Field of Classification Search
CPC ...... H04M 11/06; H04M 11/062; H04B 1/40; H04B 3/23; H04L 1/0003; H04L 1/0071; H04L 27/2647
USPC ..................... 375/219, 222, 295, 316; 326/30
See application file for complete search history.

(56) References Cited

U.S. PATENT DOCUMENTS

| 6,920,311 | B2 * | 7/2005 | Rofougaran et al. ......... 455/66.1 |
| 6,968,167 | B1 * | 11/2005 | Wu et al. .................... 455/251.1 |
| 7,840,714 | B2 | 11/2010 | Downing et al. |
| 7,859,298 | B1 | 12/2010 | Swartz et al. |
| 8,051,217 | B2 | 11/2011 | Goodart et al. |
| 2004/0119482 | A1 | 6/2004 | Tripathi et al. |
| 2006/0071683 | A1 | 4/2006 | Best et al. |
| 2011/0164665 | A1 | 7/2011 | Considine et al. |

OTHER PUBLICATIONS

Product brief, Intel Z68 Express Chipset, 2011 USA, downloaded from www.intel.com in Aug. 2012, 3 pgs.

* cited by examiner

*Primary Examiner* — Ted Wang
(74) *Attorney, Agent, or Firm* — Moser Taboada

(57) ABSTRACT

An active capacitor multiplying circuit that in one embodiment comprises (i) a clock synthesis loop filter of at least second order comprising a series combination of a first resistor and a first capacitor, wherein the series combination is coupled between a first charge pump interface and ground, wherein the clock synthesis loop filter further comprises a second capacitor coupled between the first charge pump interface and the ground; (ii) a capacitor multiplying loop filter comprising a second capacitor coupled between a second charge pump interface and the ground, wherein the capacitor multiplying loop filter further comprises a second resistor coupled to the second charge pump interface and the second charge pump interface is coupled to the first charge pump interface; and (iii) an operational amplifier, driven by the first capacitor, for driving the second resistor, wherein a voltage presented at the first charge pump interface drives a voltage controlled oscillator.

5 Claims, 15 Drawing Sheets

DIFFERENTIAL SERIAL INTERFACE FOR SUPPORTING A PLURALITY OF DIFFERENTIAL SERIAL INTERFACE STANDARDS

CROSS-REFERENCE TO RELATED APPLICATIONS

This application is a continuation of co-pending U.S. patent application Ser. No. 13/595,646, entitled "Differential Serial Interface for Supporting a Plurality of Differential Serial Interface Standards" and filed Aug. 27, 2012, which is herein incorporated in its entirety by reference.

BACKGROUND OF THE INVENTION

1. Field of the Invention

The invention relates generally to a direction-selectable differential high-speed serial interface with shared transmitter and receiver interface that support multiple video protocols (e.g., Display Port (DP), Digital Video Interface (DVI), High-Definition Multimedia Interface (HDMI), Low-voltage differential signaling (LVDS), and other protocols (e.g., Peripheral Component Interconnect Express (PCIe)).

2. Description of the Related Art

At present, video interface transceivers generally take on one of two forms: (i) high-frequency transceivers having combined transmitter and receiver in a single integrated circuit (IC) block, where the transmitter and receiver have separate paths from the substrate through solder bumps/pads, through the package to separate package balls, or (ii) low-frequency transceivers, where the transmitter and receiver share a common path with common solder bumps/pads and package balls. Such video interface transceivers are limited to supporting generally only one or two different video interface standards.

In order to support a variety of popular video interface standards (as well as non-video standards) using such transceivers, a computing device may require a large number of different physical ports, increasing physical area required by the device. Additionally, having different physical ports for different video interface standards requires a user to manage a variety of physical connections depending upon which standard is to be used at a given time.

Therefore, there is a need in the art for a peripheral interface physical layer comprising a transceiver that can support multiple peripheral interface standards.

SUMMARY OF THE INVENTION

An active capacitor multiplying circuit substantially as shown and/or described in connection with at least one of the figures, as set forth more completely in the claims.

Various advantages, aspects and novel features of the present disclosure, as well as details of an illustrated embodiment thereof, will be more fully understood from the following description and drawings.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Figure 1:
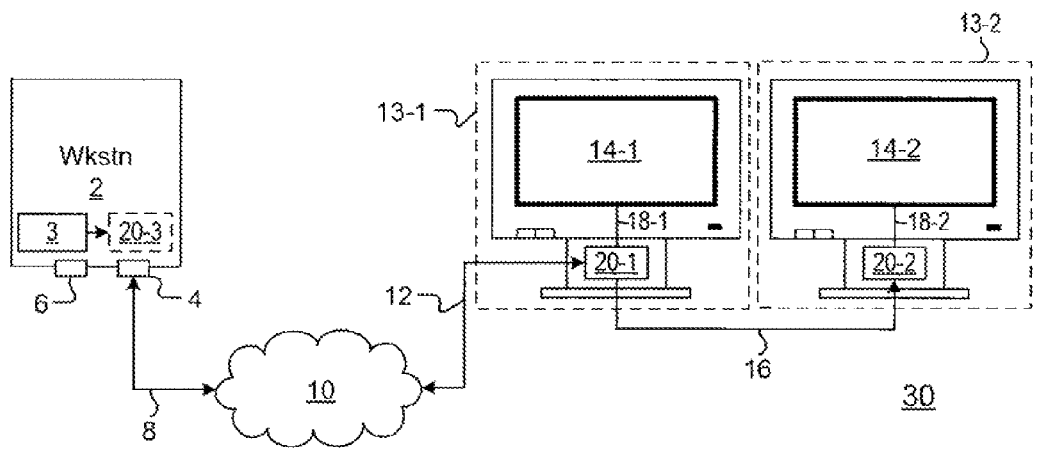
FIG. 1 is a block diagram of a networked computing system in accordance with one or more embodiments of the present invention.

FIG. 1 is a block diagram of a networked computing system 39 in accordance with one or more embodiments of the present invention. The networked computing system 30 ("system 30") comprises a workstation 2 having a Graphics Processing Unit (GPU) 3 and network interface 4 coupled, via a network cable 8, to a network 10. The workstation 2 further comprises a display interface 6 for connecting the workstation 2 to a local display device, such as a computer monitor. The workstation 2 is coupled via the network 10 to a client terminal 13-1. The client terminal 13-1 is coupled to the network 10 by a network cable 12, and is further coupled to a second client terminal 13-2 by a display cable 16. The client terminals 13-1 and 13-2 may collectively be referred to as client terminals 13, of which, in the embodiment of system 30, client terminal 13-1 functions as a primary display and client terminal 13-2 functions as a secondary display of a dual display configuration. This figure only portrays one variation of the myriad of possible network configurations. For example, system 30 may comprise numerous workstations 2 or additional/fewer client terminals 13. Another example is where workstation 2 is without a host computer card 20-3 and GPU 3 is coupled directly to client terminal 13 via display interface 6 and a suitable display cable. Yet another example comprises a single client terminal where no video connection 16 exists between 13-1 and 13-2. For simplicity and clarity, only one workstation 2 and two client terminals 13 are depicted and described.

Network 10 comprises a communication system (e.g., the Internet, LAN, WAN, and the like) that connects computer systems completely by wire, cable, fiber optic, and/or wireless links facilitated by various types of well-known network elements, such as hubs, switches, routers, and the like. The network 10 may employ various well-known protocols to communicate information amongst the network resources. For example, in an embodiment, network 10 is part of the Internet.

Workstation 2 generally comprises a central processing unit (CPU) sub-system, one or more image processing systems, memory and support circuits, for example interconnected by one or more busses (not pictured). Workstation 2 is, generally, a computer or system of computers that has been designated for running user software applications and may generate display information in the form of pixel data, graphics commands, video information and the like. For example, in an embodiment, workstation 2 executes application software and generates one or more source display images and/or source display image streams, for example with the aid of a GPU 3 and/or rendering software such as DIRECTX, OPENGL or the like. Workstation 2 generally encodes display data and transmits the encoded display data to client terminal 13-1; the client terminal 13-1 may further transmit display information to the client terminal 13-2.

Client terminals 13-1 and 13-2 comprise computer cards 20-1 and 20-2, respectively, and also comprise display elements 14-1 and 14-2, respectively; the computer card 20-1 is coupled to the display element 14-1 by interconnect 18-1 (e.g. a cable and/or set of circuit board traces), and the computer card 20-2 is coupled to the display element 14-2 by interconnect 18-2. The client terminals 13 are, generally, computing devices enabled to display image data and connect to one another, e.g., via the display cable 16, and/or to the workstation 2 via the network 10. For example, in one embodiment the coupled client terminals 13 are configured as a remote terminal in a remote computing system. Such remote terminals include thin clients, personal computers, workstations, Personal Digital Assistants (PDAs), wireless devices, and the like. In the remote computing system configuration depicted in FIG. 1, workstation 2 is configured in dual-display mode and display information associated with both displays is transmitted to client terminal 13-1. Display information associated with the first of the two displays is decoded by the computer card 20-1 and displayed on display element 14-1; display information associated with the second of the two displays is decoded by the computer card 20-1 and transmitted to the client terminal 13-2 using a standard display protocol standard, such as Digital Visual Interface (DVI) or DisplayPort (DP), for display on display element 14-2. In some such remote computing embodiments, the workstation 2 and/or one or more of the client terminals 13 may comprise one or more peripheral interfaces for the connection of peripheral devices such as a mouse, keyboard, and the like. For example, computer card 20-1 may comprise ports for connection of such peripheral devices and execute a remote computing protocol, such as Remote Desktop Protocol (RDP), Citrix's HDX, or Teradici PC-over-IP (PCoIP) protocol, for communication of peripheral device information between terminals 13 and workstation 2.

The display elements 14-1 and 14-2, collectively referred to as display elements 14, may be one or more of a Liquid Crystal Display (LCD) display; a Cathode Ray Tube (CRT) display; a plasma display; a light emitting diode (LED) display; or any other type of display capable of displaying display data, such as images, videos, and the like. In an embodiment, the display element 14 is coupled to the image processing device 116 via a conventional display controller 57

The computer cards 20-1 and 20-2, collectively referred to as computer cards 20, may each comprise an image processing device (as described below with respect to FIG. 2) for decoding encoded display information for presentation on the corresponding display element 14. In some embodiments, one or more of the computer cards 20 may each be coupled to a plurality of display elements 14, for example using multiple separate display connections such as DVI or a multiplexed display connection such as DisplayPort (DP). In some other embodiments, the workstation 2 may be directly connected to the client terminal 13-1 without the network 10: i.e., the display interface 6 of the workstation 2 may be coupled to the client terminal 13-1 by the display cable 16. In such embodiments, the client terminal 13-1 may or may not be further coupled to the client terminal 13-2 by another display cable.

The computer cards 20 each comprise a plurality of physical layer interfaces, or PHYs, that enable the remote terminals 13 to each support a plurality of different differential serial interface standards, including the video standards DisplayPort (DP), Digital Video Interface (DVI). High-Definition Multimedia Interface (HDMI), Low-voltage differential signaling (LVDS), and video graphics array (VGA), as well as the standard Peripheral Component Interconnect Express (PCIe), as described in detail below.

In the embodiment depicted in FIG. 1, the video data associated with display element 14-2 is initially received at computer card 20-1, decoded, and transmitted via display cable 16 from a transmitter on a PHY (i.e., the PHY is configured as a transmitter) of the computer card 20-1 to a receiver on a PHY (i.e., the PHY is configured as a receiver) of computer card 20-2. The video data received at computer card 20-2 may then be retransmitted to the display element 14-2 via a suitable display controller 57 (as shown in FIG. 2).

In some embodiments, a one-to-one solution is employed, where the workstation 2 comprises a computer card 20-3. The GPU 3 of the workstation 2 may drive into receivers of one or more PHYs in computer card 20-3 via one of the supported video standards. The data is packetized and sent over the network 10 (e.g., Ethernet) directly to each computer card 20-1 and 20-2. The data received on the computer card 20-1 (i.e., received on receivers of their corresponding PHYs) is then depacketized decoded and displayed.

Figure 2:
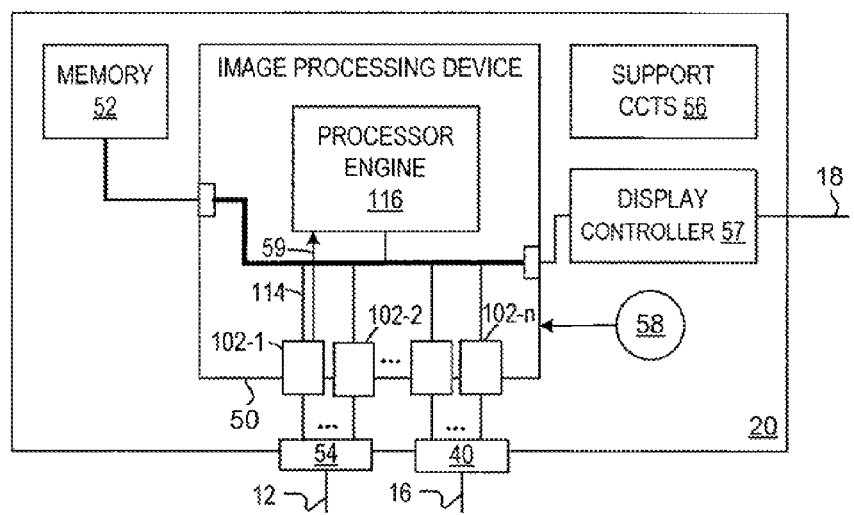
FIG. 2 is a block diagram of a client computer in accordance with one or more embodiments of the present invention.
Figure 3:
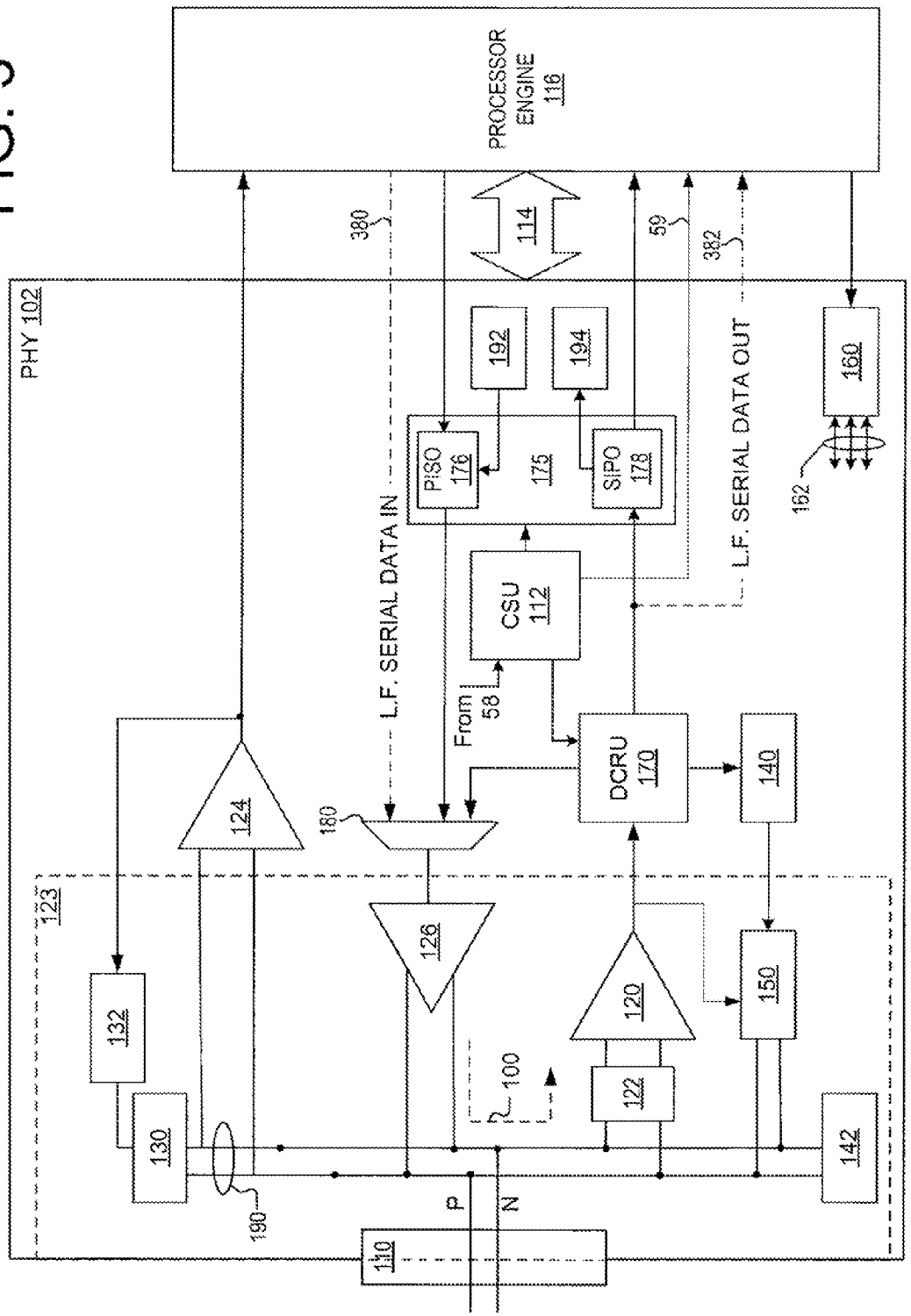
FIG. 3 is a block diagram of a physical interface (PHY) in accordance with one or more embodiments of the present invention.

FIG. 2 is a block diagram of a client computer 20 in accordance with one or more embodiments of the present invention. The client computer 20 comprises an image processing device 50, a memory 52, a network interface 54, support circuits 56, and a clock source 58. The image processing device 50 comprises a processor engine 116 (also referred to as "core 116") coupled via a system bus 114 to the memory 52 and the network interface 54, which is further coupled to the network cable 12. The image processing device 50 additionally comprises a plurality of physical layer interfaces (PHYs) 102-1, 102-2, ..., 102-n, collectively referred to as PHYs 102, coupled to the system bus 114 which, in some embodiments, may be an embedded bus or communication fabric such as an Advanced eXtensible Interface (AXI) bus. Each PHY 102 is a differential signaling serial interface comprising a transceiver that may be configured to transmit or receive data, as described in detail further below. Each PHY 102 provides a single transceiver differential line pair, referred to as a "lane" or "channel", for communicating data to and from the computer card 20; generally one of the lines is referred to as "P" and the other line is referred to as "N", as depicted in FIG. 3, and the line pair may is referred to as a P/N pair. Generally, each display interface (e.g., from the image processing device 50 to display cable 16; from a GPU to the image processing device 50) uses multiple lanes, and thereby multiple PHYs 102, most of which may be high-speed but may also include some low-speed auxiliary channel lanes. In the embodiment depicted in FIG. 2, a plurality of PHYs 102 and select control signals from processor engine 116 are terminated at a network interface 54 which connects to network cable 12. Additionally, a plurality of PHYs 102 and select control signals from processor engine 116 are terminated at a display connector 40, where the display connector 40 is coupled to the display cable 16 to interconnect the client terminal 13-1 and client terminal 13-2. In one or more other embodiments, one or more additional PHYs 102 may be terminated at additional connectors (such as additional display interfaces or data interfaces (e.g. PCI-e) for connecting the client terminal 13-1 to one or more other display apparatus, client terminals or computer equipment.

It will be appreciated by those of ordinary skill in the art that in some embodiments, the client computer 20 also comprises mechanical housing components, connectors, power supplies, and the like not shown in FIG. 2.

In some embodiments, the client computer 20 is implemented, at least in part, as a system-on-chip (SoC), a processor, a microprocessor, a microcontroller, a computer system, and/or a programming or a processing environment configured to provide control and/or management functions for client computer 20 and further enabled to receive and to decode encoded display data, such as a sequence of image frames, image regions or one or more progressively encoded image streams. The client computer 20 may be implemented using a general purpose computer that, when executing particular software, becomes a specific purpose computer for performing various embodiments of the present invention.

According to various embodiments, client computer 20 also includes one or more interfaces for connection to Human Interface Devices (HIDs), peripheral components (e.g., microphones, speakers, and the like), other interfaces such as a USB interface, and other components, interfaces, and/or connections associated with computer systems, desktop computers, and/or processors.

Memory 52 may comprise random access memory, read only memory, removable disk memory, flash memory such as one or more of: electronic, magnetic, optical, and/or other types of storage media; volatile computer-readable media, such as RAM, DRAM, SRAM, DDR RAM or XDR RAM; and nonvolatile computer-readable media, such as ROM, hard drive, tape, CDROM, DVDROM, magneto-optical disks, EPROM, EEPROM, Flash EPROM or various combinations of these types of memory for storing data and/or computer-readable instructions. Memory 52 stores various software, firmware and/or data structures, for example as related to the present invention. In various embodiments, memory 52 stores information such as received image data, decoded image information, decoded raster image information in a format accessible to display element 14, and information associated with processor engine 116 such as software and/or data used by processor engine 116. In various embodiments, memory 52 may be partitioned and/or distributed.

Support circuits 56 may include one or more of power supplies, clock circuits, data registers, I/O interfaces, network interfaces, and the like. The support circuits 56 support the functionality of system bus 114, processor engine 116, memory 52, network interface 54, clock source 58 and the PHYs 102. In an embodiment, the support circuits 56 provide link layer and other functions (e.g., Hot Plug Detect, Display Data Channel (DDC) functions, Extended Display Identification Data (EDID) functions, HDCP functions and the like) required by display protocol standards and/or PCIe standards.

The clock source 58 provides a low-frequency reference clock to the PHYs 102. In an embodiment, a select PHY 102-n utilizes the clock source 58 to generate a high-frequency system clock 59 used as a primary high-speed clock for computer 20, including system bus 114 and processor engine 116.

In accordance with one or more embodiments of the present invention, each PHY 102 comprises a wide-frequency range (e.g., from 10 MHz to 8 GHz), wide common mode voltage range (i.e., rail-to-rail common mode range) transceiver that supports a plurality of video standards, including but not limited to DP, DVI, HDMI, LVDS, and VGA, and at least one miscellaneous standard, such as PCIe, as described in detail below.

FIG. 3 is a block diagram of a physical interface (PHY) 102 in accordance with one or more embodiments of the present invention. The PHY 102 is composed of a shared differential serial interface with direction-selectable transceiver module 123 and a SIPO, PISO, CSU and DCRU modules. More specifically the transceiver 123 is comprised of a direction-selection transceiver 123 having both a receiver module 120 and a transmitter module 126 for supporting a plurality of standards (e.g., DP, DVI, HDMI, LVDS, and VGA, and PCIe) as described in detail further below. The PHY 102 comprises a shared differential interface 110 (referred to as "differential interface 110") coupled to "P" and "N" lines (i.e., P/N pair) of a bus 190. The bus 190 (i.e., both lines P and N) is further coupled to an adjustable termination resistance circuit 130 (also referred to as "resistance circuit 130"), an output of a transmitter module 126, a common mode isolation circuit 122, a calibration circuit 150, electrostatic discharge (ESD) protection circuit 142, and an input of a frequency-based load detector (FRLT) 124. An output from the FRLT 124 is coupled to the resistance circuit 130, and the resistance circuit 130 is further coupled to a variable voltage module 132. The common mode isolation circuit 122 is further coupled across an input of a receiver module 120, and an output from the receiver module 120 is coupled to a digital clock recovery unit (DCRU) 170; in some embodiments, a second input to the receiver module 120 is coupled directly to the bus 190 (i.e., without a common mode isolation circuit).

Outputs from the DCRU 170 are coupled to each of a data eye calibration circuit 140, a multiplexer 180, and a de-serializer 178 of serial-in-parallel-out/parallel-in-serial-out module 175 ("SIPO/PISO 175"); additionally, the DCRU output to the de-serializer 178 is further connects to a low-frequency serial data path output 382. A serializer 176 of the SIPO/PISO 175 is coupled to a pattern generator 192 of the PHY 102 and, via the system bus 114, to the core 116 for receiving input data from the pattern generator 192 and the core 116; the de-serializer 178 is coupled to a pattern monitor 194 of the PHY 102 and, via the system bus 114, to the core 116 for providing output data to the pattern monitor 194 and the core 116. An output from serializer 176 is coupled to an input of the multiplexer 180, which also receives low-frequency serial data input data 380 from the core 116 in those embodiments in which PHY 102 is configured to support a low-frequency protocol (e.g., typically below 100 mbps), such as an auxiliary channel of a display protocol, an I²C connection or the like. The output of the multiplexer 180 is coupled to the input of the transmitter module 126.

On a transmit path of the PHY 102, a parallel data stream is transmitted from the core 116 to the serializer 176 of the SIPO/PISO 175 via the system bus 114. The serializer 176 is employed in those embodiments in which PHY 102 is configured to support high-frequency protocols (e.g., typically above 100 mbps), such as DisplayPort or PCI-e data channels by transmitting a high-speed serial data stream from its serial output to the transmitter module 126 via the multiplexer 180: in those embodiments in which the PHY 102 is not configured to support high-frequency protocols, e.g., typically when supporting those below 100 mbps, the low-frequency serial data output path 382 coupled the data from the DCRU 170 to the processor engine 116, bypassing the serializer 176. The output from the transmitter module 126 is transmitted to the differential interface 110 via the bus 190.

On a receive path of the PHY 102, a serial data stream eceived by the differential interface 110 and is coupled, via the bus 190 and the common mode isolation circuit 122, to the input of the receiver module 120. The recovered serial data stream from the receiver module 120 is coupled, via the DCRU 170, to the de-serializer 178 of the SIPO/PISO 175. The DCRU 170 recovers the clock from the incoming data stream (i.e., the DCRU 170 generates a clock centered on the data eye) and uses the recovered clock to clock the de-serializer 178, which converts the received serial data stream to a parallel data stream and couples the parallel data stream to the core 116 via system bus 114. The DCRU 170 efficiently enables on-the-fly data eye calibration for the PHY 102. Receiver module 120 may contain equalization; i.e., the receiver module 120 may have the ability to measure the incoming signal eye and adjust internal equalization or communicate with upstream devices to negotiate more pre-emphasis. The output of receiver module 120 is also coupled to calibration circuit 150 for performing full link calibration data eye calibration.

The PHY 102 may be configured on-the-fly; i.e., PHY 102 may be configured in real-time during operation to switch between a receive mode and a transmit mode (i.e., the transceiver 123 of the PHY 102 is direction-selectable), to change drive/pre-emphasis levels, to change the termination values, and to change the termination rail (i.e., the supply voltage level), without requiring additional external circuitry i.e., circuitry external to the PHY 102) or additional calibration.

The PHY 102 further comprises a common clock synthesis unit (CSU) 112, coupled to the SIPO/PISO 175 and the DCRU 170. The CSU 112 receives a clock signal from the low-frequency reference clock source 58 and uses the received clock signal to synthesize a high-speed clock which is then distributed to SIPOIPISO 175, the DCRU 170, and the calibration circuit 150 (via the DCRU 170/data eye calibration circuit 140). Additionally, the CSU 112 of one PHY 102 generates the high-frequency system clock 59 for the core 116.

Mode control 160 is coupled on its input side to the core 116 and generally serves as a control interface between the core 116 and the PHY 102, for example by providing a set of registers accessible by core 116 for setting parameter values associated with the programmable functional modules within the PHY 102 via collective control interfaces 162.

As described above, the input of the receiver module 120 may be coupled to the differential interface 110 via common mode isolation circuit 122 and the output of the receiver module 120 may be coupled via the DCRU 170 to the de-serializer 178, as depicted in FIG. 3. In some alternative embodiments, rather than being coupled to de-serializer 178, the receiver module 120 may be coupled via serial data path 382 directly to a low-frequency serial data input of the core 116 (e.g., via system bus 114).

The receiver module 120 amplifies and equalizes high-speed serial data streams received from the differential interface 110. As further described below, the receiver module 120 in conjunction with the common mode isolation circuit 122 appears as a low-capacitance load to the differential interface 110 and supports a wide frequency range (e.g., 10 MHz to 8 GHz) and a wide common mode voltage range (a rail-to-rail common voltage range, e.g., 0V to 3.3V) and supports a plurality of standards, including but not limited to DP, PCIe, DVI, HDMI, and LVDS. The receiver module 120 supports different pattern encoding schemes (for example, 8b/10b, Pseudo-Random-Bit Sequence of length 23 (PRBS23), 128b/130b, Transition Minimized Differential Signaling (TMDS), and the like) with different run lengths from, for example, 10b to 130b. Additionally, the receiver module 120 is coupled via the bus 190 to the ESD protection 142 to meet ESD compliance standards associated with the range of interface standards (e.g., DVI, DP, PCI-e, and the like) supported by the PHY 102.

In some embodiments, the receiver module 120 may be implemented with a series of cascaded stages (i.e., multiple gain stages) of high-bandwidth thin oxide NMOS or PMOS based CML (current mode logic), with adjustable equalization amplifiers, as described further below with respect to FIGS. 4 and 5.

The transmitter module 126 is a variable impedance, wide common mode voltage range, high-frequency transmitter coupled between the differential interface 110, and the serializer 176 via the multiplexer 180. As further described below, the transmitter module 126 operates in either a single-ended or a differential mode, and appears as a low-capacitance load to the differential interface 110. For each of a plurality of standards (including DP, PCIe, DVI, HDMI, LVDS, and VGA), the transmitter module 126 supports the required transmit return loss, drive levels, pre-emphases levels, frequency range (e.g., the transmitter module 126 allows frequencies over the entire frequency range, as dictated by the supported standards, with minimal distortion), pulse rise and fall times, and supports a rail-to-rail common mode voltage range (e.g., between 0V and 3.3V). The transmitter module 126 buffers the data from the serializer 176 to obtain the appropriate output drive level. Additionally, the transmitter module 126 is coupled via the bus 190 to the ESD protection 142 to meet ESD compliance standards associated with the range of interface standards (e.g., DVI, DP, PCI-e, and the like) supported by the PHY 102.

The resistance circuit 130 is a termination resistance circuit that provides adjustable termination (as controlled by the mode control 160) for both the receiver module 120 and the transmitter module 126. Such termination may be terminated to multiple voltages (also referred to as rails); the variable voltage module 132 is coupled to the resistance circuit 130 for selecting the voltage or rail for termination for both the receiver module 120 and the transmitter module 126. As further described below, the resistance circuit 130 appears as a low-capacitance load to the differential interface 110 and supports a rail-to-rail common mode voltage range (e.g., from 0V to 3.3V). The resistance circuit 130 comprises a plurality of resistors coupled in parallel, where a desired number of resistors may be selected (i.e., activated by the mode control 160) so that the resistance circuit 130 has enough adjustment to compensate for process variation of switches and is adjustable to 50 ohms+/−5%. One embodiment of the resistance circuit 130 is described below with respect to FIG. 11.

The calibration circuit 150 is enabled to calibrate (i.e., tune) transmission drive levels, termination values (resistance and voltage), and pre-emphasis/de-emphasis levels of the PHY 102 without a replica circuit to support each of a plurality of standards (including DP, PCIe, DVI, HDMI, LVDS, and VGA). The calibration process is generally controlled by a processor function such as software or firmware executed by core 116 in conjunction with the mode control 160. The calibration circuit 150 provides a low-capacitance footprint to the differential interface 110 (achieved by direct-coupling an ADC of the calibration circuit 150 through a resistive voltage divider) to minimize effect on return loss specifications and supports a wide common mode voltage range (a rail-to-rail common mode voltage range, e.g., between 0V and 3.3V).

Figure 16:
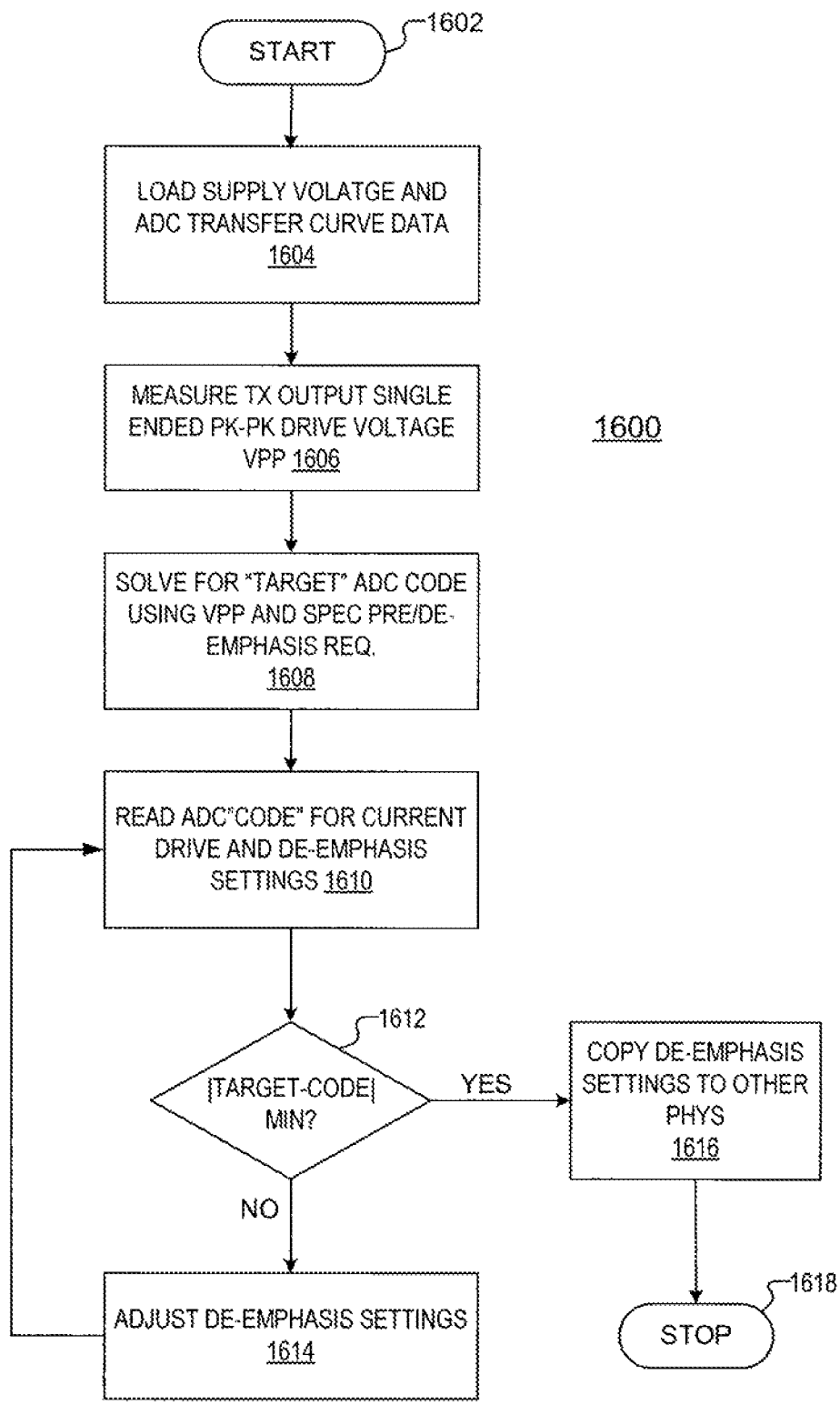
FIG. 16 is a flow diagram of a method for pre-emphases level calibration in accordance with one or more embodiments of the present invention.
Figure 17:
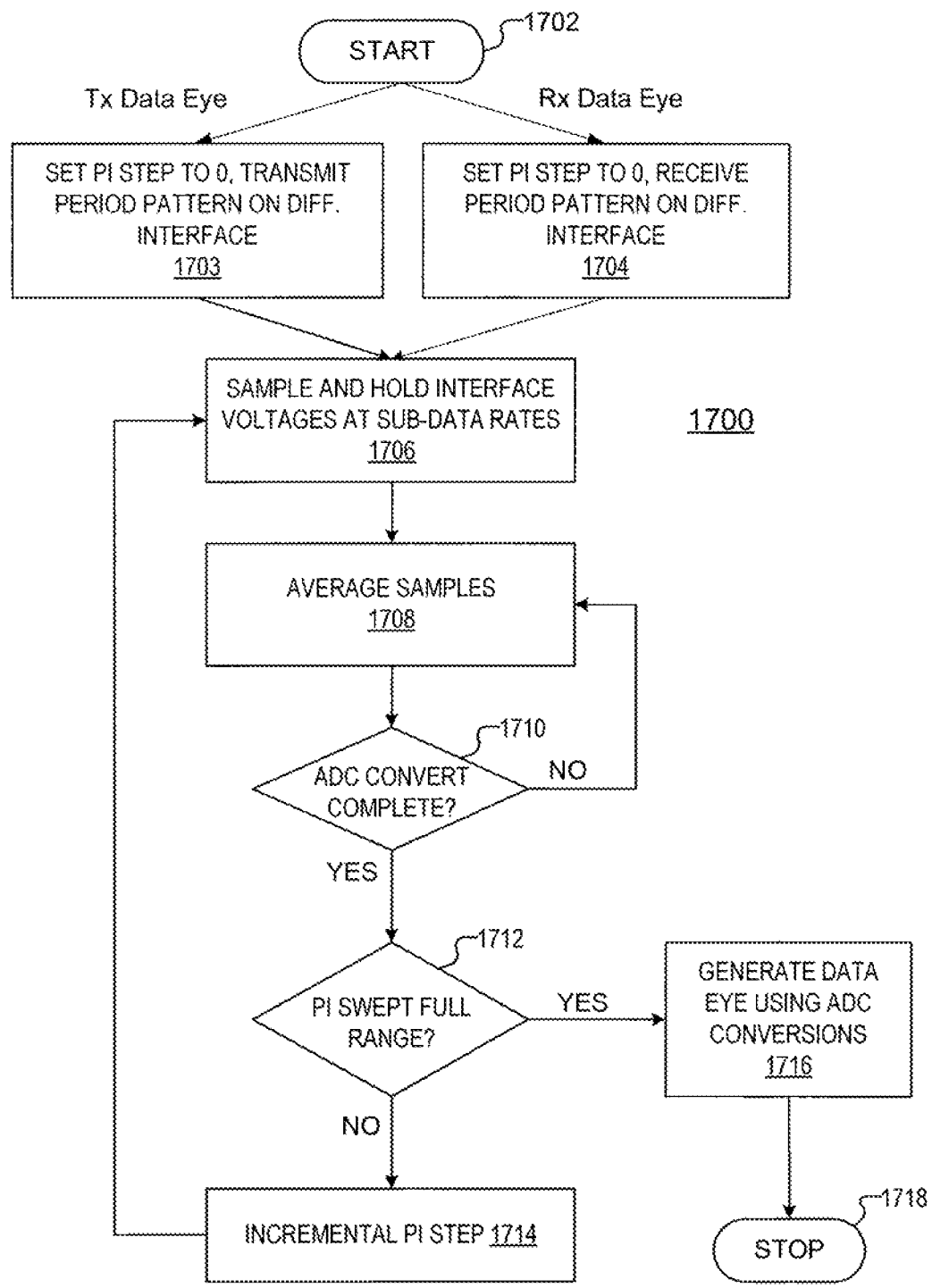
FIG. 17 is a flow diagram of a method of data eye calibration accordance with one or more embodiments of the present invention.

The calibration circuit 150 works with the resistance circuit 130 and the transmitter module 126 to perform the required calibrations for the PHY 102 as described below with respect to the method 1400 for termination resistance calibration (FIG. 14), the method 1500 for drive level calibration (FIG. 15), the method 1600 for pre-emphases/de-emphases calibration (FIG. 16), and the method 1700 for data eye calibration (FIG. 17).

The calibration sequence is generally implementation specific and depends on the design of an ADC within the calibration circuit 150. In some embodiments, the calibration sequence for the PHY 102 comprises termination calibration (described below with respect to FIG. 14), calibration of the ADC, drive level calibration (described below with respect to FIG. 15), and pre-emphasis level calibration (described below with respect to FIG. 16). The termination calibration is performed on a single PHY 102 of the chip and the resultant setting is then programmed into all remaining PHY102s, while the drive level and pre-emphasis level tuning can be done on all the PHY 102 slices if needed. Calibration of the pre-emphasis level may be done upon powering up the chip to determine fixed amounts of pre-emphasis, e.g., 3.5 dB, 6 dB, 9 dB, and the like.

For link level training as required by some supported specifications, such as DP, the amount of equalization and pre-emphasis is negotiated once the PHY 102 is connected in a system. For the link level training, a downstream PHY transmitter is attached to an upstream PHY receiver to connect the link, and specific parameters required by the supported standard, such as drive levels, pre-emphasis levels, and equalization setting, may be set such that no errors are received by the PHY receiver.

Following the pre-emphases level calibration, the data eye is analyzed (i.e., as described below with respect to the method 1700 for data eye calibration) to ensure that the previously calibrated drive and pre-emphasis levels are adequate. If the data eye is found to violate the corresponding eye mask specification, the drive level and/or pre-emphasis may be tuned to clean-up the signal relative to the specification eye mask. A feature of the design is that a user is enabled to view drive levels, data eyes, and pre-emphasis levels of an actively coupled PHY 102 without a need to disconnect cabling or underlying circuit board, or attach a scope.

During the calibration process, the calibration circuit 150 may tune driver strength and termination, where the drive level may be adjusted either in steps or on-the-fly, and the termination rail may be selected on-the-fly. During calibration, the calibration circuit 150 may be thought of as a scope probe where the differential interface 110 circuit point may be probed.

The calibration circuit 150 provides a calibrated observation point and thus allows calibration on the data lane without a replica circuit. This is achieved by calibrating the adjustable termination resistance circuit 130 with an external resistance, then calibrating the ADC, and finally with this calibrated observation point the drive and pre-emphasis levels can be calibrated.

The data eye calibration circuit 140 provides on-the-fly (i.e., real-time) data eye calibration. The integrated direction-selectable PHY 102 allows for a unique testability feature of data eye testing with full downstream receiver/upstream transmitter and cable attached. The transmitter/receiver data eye can be recorded internally since the differential interface 110 is shared for transmitter and receiver. Method 1700, described below with respect to FIG. 17, describes one method for obtaining the data eye. This unique testability feature provides the ability to measure the performance of the entire communication link including transmitter/receiver, channel media, and downstream receiver/upstream transmitter without attaching test instruments which may affect the link, thus enabling optimization of the performance of the link by monitoring the eye and changing the transmit drive and de-emphasis settings to match the channel media.

The PHY 102 allows a single identical instance to be instantiated multiple times (M) on silicon; for example, M may be 21 links if driving one DP monitor and three DVI/VGA monitors.

The CSU 112 is a shared CSU which provides a clock to the core 116 and provides clocks for both transmit and receive paths through the SIPO/PISO 175; i.e., the CSU 112 is shared for both the serializer 176 of the PISO, and to the de-serializer 178 of the SIPO. Additionally, the CSU 112 is shared with the calibration circuit 150 and DCRU 170.

The CSU 112 receives a low-frequency reference clock from the reference clock source 58 and multiplies the clock up to a desired data rate for supporting each of the desired standards. For example, for supporting the DP standard, the CSU 112 may receive an input dock at 100 MHz and increases the input clock by a factor of 27 to provide an output clock at 2.7 GHz. In some embodiments, the CSU 112 is an analog CSU and typically uses a loop zero which is implemented with a resistor and capacitor. To meet the bandwidth and stability requirements, the loop capacitor can be a large part of the PHY die area. The loop capacitor is the zero for a second order feedback loop. To reduce the loop zero capacitance size, a traditional capacitance multiplier can be used. Two embodiments of capacitor multipliers are described further below with respect to FIGS. 8 and 9.

The FRLT 124 generally operates as a very low frequency receiver for providing receiver-detect functionality, thereby enabling the PHY 102 to support the PCI standard which requires a special handshake between downstream and upstream devices before communication may begin.

The PHY 102 comprises a full-rate internal loopback testability functionality 100 (testability functionality 100"). The testability functionality 100 allows data to be sent from the pattern generator 192 through serializer 176 to the transmitter module 126 and then looped back to the receiver module 120 and through de-serializer 178 to the pattern monitor 192 over full data rate range, with a range of different encoding schemes (for example, 8b/10b, Transition Minimized Differential Signaling (TMDS), Pseudo-Random-Bit Sequence of length seven (PRBS7), arbitrary, and the like). The testability functionality 100 enables interval testing of the full rate (e.g., 8 GHz) integrated direction-selectable PHY 102 over the full drive range and termination settings, as well as frequency range testing over a wide range of patterns (such as PRBS, 8b/10b, arbitrary, and the like).

The PHY 102 additionally comprises a diagnostic functionality to check the recovered data at the DCRU 170 (centering of recovered clock, relative to receive data) on adjacent transmitter, as described further below with respect to FIG. 12.

Figure 13:
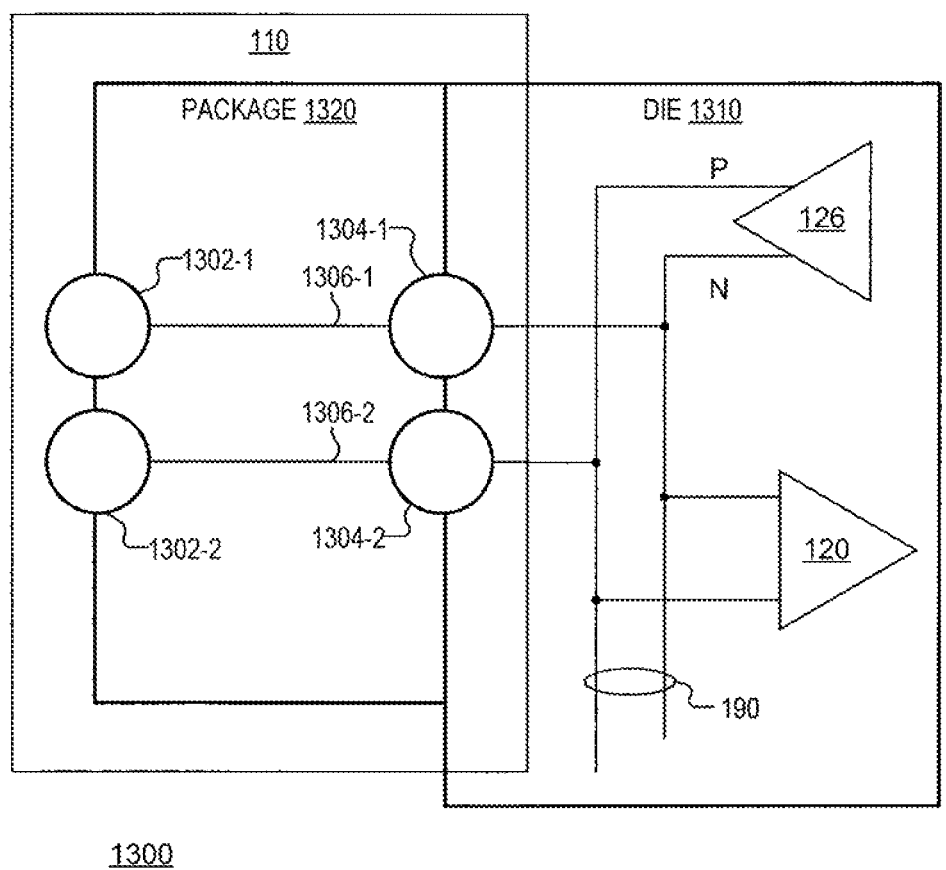
FIG. 13 is a functional block diagram of shared package balls and silicon bumps of a differential interface in accordance with one or more embodiments of the present invention.

In accordance with one or more embodiments of the present invention, the PHY 102 supports a plurality of standards, including but not limited to DP, PCIe, DVI, HDMI, LVDS, and VGA, by supporting the operating parameters corresponding to each standard. In order to support a frequency range from 10 MHz to 8 GHz with minimal distortion, the differential interface 110 must have the transmitter module 126 and the receiver module 120 share a common bump/trace/ball for each P and N as shown in FIG. 13 and described further below. Furthermore, the PHY 102 must meet the corresponding specifications for each supported standard for transmit and receive return loss, common mode voltages, transmit pulse rise and fall times, receive termination values, supported frequencies (e.g., allowing frequencies from 10 MHz to 8 GHz to pass with minimal distortion), and electrostatic discharge (ESD) (e.g., the differential interface 110 must support ESD structures 142, coupled to the differential interface 110 via the bus 190, to meet relevant specifications such as Human Body Model (HBM), Machine Model (MM), and Charge Device Model (COM)).

In order to meet such requirements, one criteria that must be met is minimizing the capacitance of each device coupled to the differential interface 110 via the bus 190 (e.g., the transmitter module 126, the receiver module 120, the FRLT 124, ESD protection circuit 142, the resistance circuit 130, and the calibration circuit 150) and the combined traces connected between external package bumps. For example, in order to minimize the capacitance footprint of the ESD protection circuit 142, the corresponding diodes are sized down to be as small as possible while still meeting relevant ESD requirements. Additionally, P/N traces in the differential interface 110 are spread out as much as possible to reduce capacitance.

Figure 21:
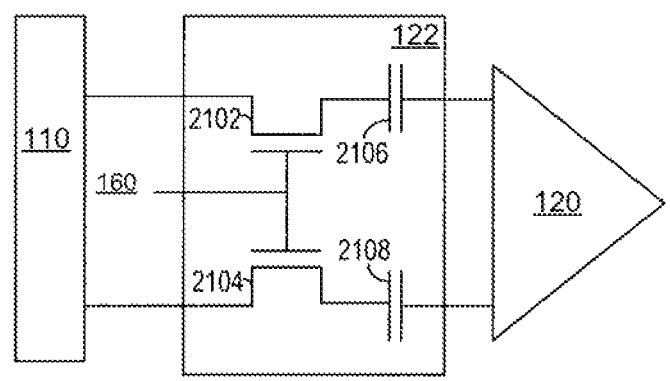
FIG. 21 is a block diagram of a common mode isolation circuit in accordance with one or more embodiments of the present invention.

To support a large common-mode range with a thin oxide receiver, the receiver module 120 can be isolated using a common mode isolation circuit 122. The common mode isolation circuit 122 may be implemented by various means including by a metal-metal capacitor, a metal-oxide-metal capacitor, a metal-insulator-metal capacitor, an active capacitor, active devices or some combination thereof, where the parasitic capacitance is required to be low-capacitance with respect to the differential interface 110 such that effective impedance remains within required limits (as specified in the relevant standards) of 50 ohm, single-ended. FIG. 21 shows one embodiment of a common-mode isolation circuit 122. When PHY 102 is configured as a transmitter, the switches within the common mode isolation circuit 122 are turned off. The switch capacitance that appears on the differential interface 110 is much lower than the DC blocking capacitor capacitance, effectively reducing the capacitance that the receive node places on the differential interface 110.

As part of minimizing the aforementioned capacitance, the transmitter module 126 comprises a buffered thick oxide adjustable NMOS gate configured as a pass gate, where the NMOS pass gate resistance can be adjusted by selecting additional gates in parallel and/or adjusting the gate bias voltage. Additionally, a driver of the transmitter module 126 comprises either a standard CMOS gate or CML gate, and the drive level may be adjusted by adjusting the number of drivers and drive strengths. One embodiment of the transmitter module 126 is described further below with respect to FIG. 6.

Also as part of minimizing the aforementioned capacitance, the resistance circuit 130 may be gated by an array of thick oxide adjustable NMOS/PMOS gates, configured as a pass gates. One embodiment of the resistance circuit 130 is described with respect to FIG. 11.

In some embodiments, the transceiver 123 is part of a system-on-chip (SoC) design and the SoC supports direct coupling to a multi-standard peripheral interface connector in absence of external bias circuitry (i.e., no additional bias circuitry is needed).

Figure 4:
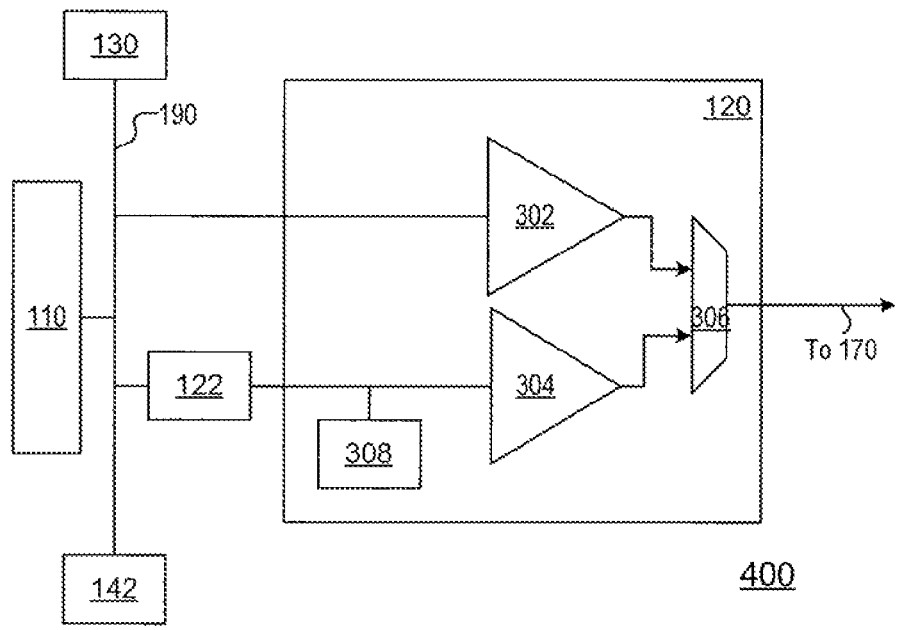
FIG. 4 is a block diagram of a receiver module in accordance with one or more embodiments of the present invention.

FIG. 4 is a block diagram of a receiver module 120 in accordance with one or more embodiments of the present invention. The receiver module 120 comprises a receiver 302 and a receiver 304, each having outputs coupled to a multiplexer 306; the output from the multiplexer 306 is coupled to the DCRU 170. The input of receiver 304 is coupled to the common mode isolation circuit 122 and to a common mode adjustment circuit 308 (i.e., both terminals of the common mode isolation circuit 122 are coupled to the input of receiver 304 as well as the common mode adjustment circuit 308, although only a single line is depicted for simplicity), and the input of receiver 302 is coupled to the bus 190 (i.e., to both lines P and N although only a single line is depicted for simplicity). Common mode isolation circuit 122 removes the incoming common mode (for example, DVI signals may have up to 3.3V common mode) in order to protect those devices on the receiver 120 having requirements of positive supply voltages on the order of 1V. The common mode adjustment circuit 308 adds a DC offset to the incoming signal to receiver 304 to establish a reasonable common mode for the receiver 304 to operate correctly (e.g., on the order of half of the positive supply voltage) In one embodiment, the common mode adjustment circuit 308 may be a programmable voltage divider.

The receiver 302 is a 3V NMOS/PMOS CML receiver, a thick oxide receiver that can withstand 3V and, in some embodiments, support frequencies up to the order of 2 GHz, although in other embodiments the receiver 302 may support frequencies higher than 2 GHz. The receiver 304 is a 1V NMOS/PMOS CML receiver, a thin oxide receiver than can withstand 1V and can support high frequencies, such as 8 GHz. By utilizing both the receiver 302 and the receiver 304, the receiver module 120 can support standards such as PCIe and DP, which are ground-referenced based designs and high-speed, as well as DVI and HDMI, which are DC coupled and terminated to 3.3V. Such a configurable termination is able to pull high, terminate to for example 3.3V or terminate to ground, depending on which standard the received data is based on. As described above, the common-mode isolation circuit 122 capacitively couples to the thin oxide receiver 304 to prevent the common mode voltage across the receiver 304 from becoming large enough to damage the receiver 304. One embodiment of a common-mode isolation circuit 122 is shown in FIG. 21, with pass gates 2102 and 2104, and DC blocking capacitors 2106 and 2108 implemented as either metal-metal capacitor, a metal-oxide-metal capacitor, a metal-insulator-metal capacitor, an active capacitor.

Figure 5:
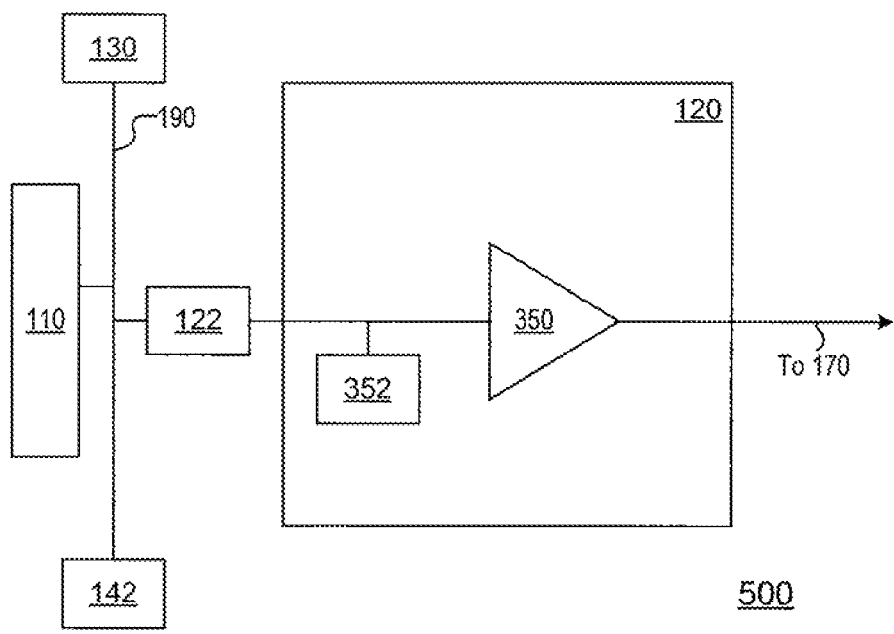
FIG. 5 is a block diagram of a receiver module in accordance with one or more other embodiments of the present invention.

FIG. 5 is a block diagram of a receiver module 120 in accordance with one or more other embodiments of the present invention. The receiver module 120 comprises a receiver 350 having an input coupled to the common mode isolation circuit 122 (i.e., both lines P and N, although for simplicity only a single line is depicted) and a common mode adjustment circuit 352, and an output coupled to the DCRU 170. The frequency knee of the common mode isolate circuit 122 must be low enough to support DVI run lengths at 250 Mbps monitor rates.

The receiver 350 is a 1V NMOS/PMOS CML receiver, a thin oxide receiver than can withstand 1V and can support high frequencies, such as 8 GHz, that is isolated from the differential interface 110 via the common mode isolation circuit 122. The common mode isolation circuit 122 allows the receiver 350 to handle high common mode requirements for DVI/HDMI. The receiver 350 also has a built in equalizer as per DP and PCIe standards requirements. The common mode adjustment circuit 352, analogous to the common mode adjustment circuit 308 of FIG. 4, adds a DC offset to the incoming receiver 350 to establish a reasonable common mode for the receiver 350 to operate correctly (e.g., on the order of half of the positive supply voltage). In one embodiment, the common mode adjustment circuit 352 may be a programmable voltage divider.

Figure 6:
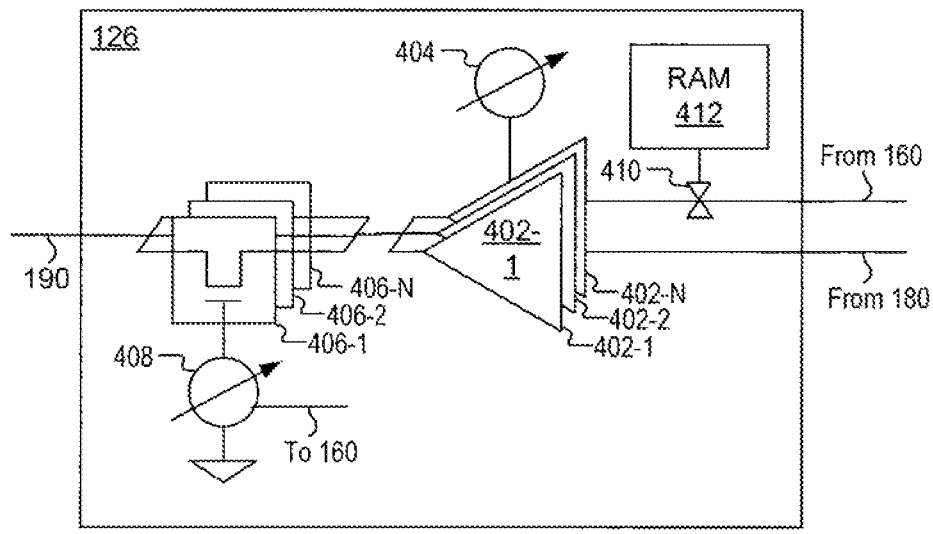
FIG. 6 is a block diagram of a transmitter module in accordance with one or more embodiments of the present invention.

FIG. 6 is a block diagram of a transmittermodule 126 in accordance with one or more embodiments of the present invention. The transmitter module 126 comprises a plurality of thin oxide transmitter drivers 402-1, 402-2, . . . 402-N (collectively referred to as transmitter drivers 402) with outputs coupled to a plurality of thick oxide gates 406-1, 406-2, . . . , 406-N (collectively referred to as thick oxide gates 406)—the outputs from all of the transmitter drivers 402 are connected together and coupled to all of the thick oxide gates 406. In some embodiments, such as the embodiment depicted in FIG. 6, there are thirty-two transmitter drivers 402 and thirty-two thick oxide gates 406.

Each of the transmitter drivers 402 is coupled to a configurable supply voltage 404, which uses a configurable voltage regulator. Each of the thick oxide gates 406 is coupled to a configurable gate voltage 408, which is further coupled to ground and to mode control 160. The thick oxide gates 406 are further coupled to bus 190. A switch 410 is coupled to a RAM 412 and to each of the transmitter drivers 402, as well as to the mode control 160. The RAM 412 stores data which linearizes the transmitter non-linearities for Video DAC and VGA applications. Each of the transmitter drivers 402 is also coupled to the multiplexer 180. When the transmitter is configured for VGA, it operates with a single-ended analog signal with a grounded return suitable for interface to a Video Graphics Array (VGA).

Each of the transmitter drivers 402 receives a serialized data stream input from the PISO 176 via the multiplexer 180 (i.e., the parallel data output from the core 116 is serialized through serializer 176 and coupled to the transmitter drivers 402 through the multiplexer 180). The output of the transmitter drivers 402 drives the thick oxide gates 406, and the output of the thick oxide gates 406 drives the data out onto the differential interface 110 for downstream transmission. The configurable gate voltage 408 adjusts the gate bias of the thick oxide gates 406 which adjusts the resistance in the corresponding CMOS gate; i.e., it acts as a voltage controlled resistor. A DAC (not shown) within the configurable gate voltage 408 controls the gate bias voltage based on control signals received from the core 116 via the mode control 160. Mode control 160 further controls the switch 410 which selects data from either RAM 412 or from the SIPO/PISO 175 (via multiplexer 180), where the data from the SIPO/PISO 175 is used for DP, DVI, PCIe, and HDMI applications, and data from RAM 412 is for VGA or Video DAC applications.

Each of the transmitter drivers 402 is implemented with a thin oxide device; in some embodiments each of the transmitter drivers 402 combined with the thick oxide gates 406 may be implemented with either standard CMOS drivers, while in other embodiments each of the transmitter drivers may be implemented with standard CML drivers with 50 Ohm effective impedance loads. Such implementation allows the transmitter drivers 406 to meet frequency requirements of 8 Gbps.

The thick oxide gates 406 are thick oxide adjustable and selectable pass gates which can be tuned to meet return loss requirements for each standard supported by the PHY 102. In order to meet return loss requirements over the appropriate frequency range for each supported standard, the effective resistance R (i.e., the sum of Rp (the effective resistance of the transmitter drivers 402 to configurable supply voltage 404 or to ground) and Rpgds (the effective pass gate resistance across the thick oxide gates 406)) when looking into the node from the differential interface 110 must be 50 ohm, in order to achieve an effective resistance R of 50 ohm, a combination of the transmitter drivers 402 (i.e., a number of transmitter drivers 402, which determines the drive level) and configurable supply voltage 404 are adjusted to tune the resistance Rp, and the number of thick oxide gates 406 and configurable gate voltage 408 are adjusted to tune Rpgds such that the sum of Rp and Rpgds is 50 Ohms +/−5%. During calibration for transmit levels, described further below with respect to the method 1500, a look-up table is generated with three variable sets (configurable supply voltage 404, number of transmit fingers (i.e., active transmitter drivers 402), and number of pass gates, 406) to obtain a specific drive level and return loss.

In addition, by adjusting the gate resistance, the pulse rise/fall times can be adjusted to ensure meeting DP, DVI, PCIe, HDMI, and VGA specification requirements.

In some embodiments, the transmitter drivers 402 may operate as an 8-bit Video DAC. In such modes, 3 lanes operate as RGB (red, green blue) color channels to produce VGA signaling. Having one PHY 102 that can drive multiple video standards greatly reduces SoC die size. The drive strengths are size binary weighted (for example, 1/32, 1/16, 1/8, 1/4, 1/2, 1, 2, 4, etc.). The driver profile is nonlinear versus drive level. To operate the transmitter drivers as a Video DAC, the RAM 412 is used as a look-up table to select which transmitter drivers 402 to turn on in order to maximize linearity.

In some embodiments, the transmitter module 126 may operate as a differential output, while in other embodiments the transmitter module 126 may operate with two single-ended outputs. Such operation allows two independent data streams from an adjacent slice (i.e., a PHY 102). FIG. 12 depicts two DCRU signals to be transmitted out of a single transmitter driver 402, for example to view recovered clock and receive data from an adjacent slice to determine functionality of the DCRU 170. To support the full frequency range of DC to 8 GHz, two transmitter paths are present in the PHY 102; the output from the transmitter will either come from a serializer 176 path or make a direct connection with core 116 for the low-frequency signals (i.e., low-frequency serial data input data 380).

Figure 7:
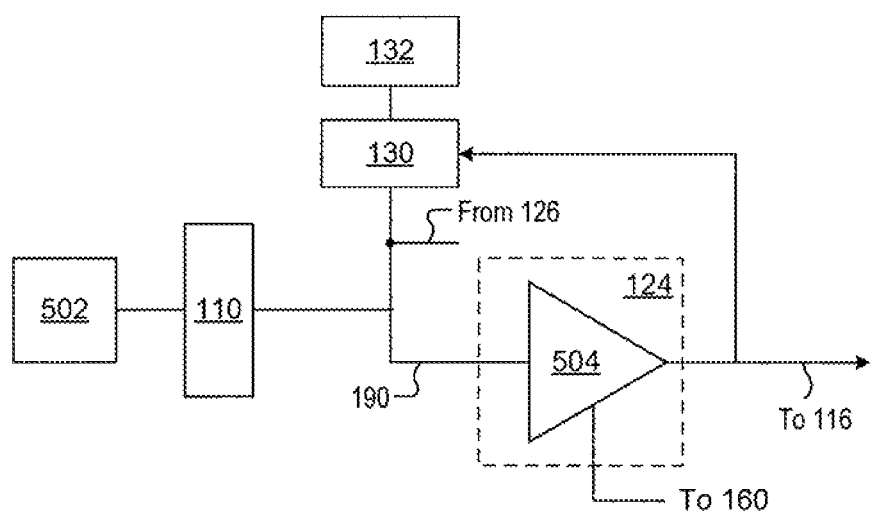
FIG. 7 is a block diagram of a frequency-based load detector (FRLT) in accordance with one or more embodiments of the present invention.

FIG. 7 is a block diagram of an FRLT 124 in accordance with one or more embodiments of the present invention. The FRLT 124 comprises a Schmitt trigger 504 having an input coupled, via the bus 190, to the adjustable termination resistance circuit 130, the output of the transmitter 126, and the differential interface 110; and an output coupled to the adjustable termination resistance circuit 130 and to the core 116. The Schmitt trigger 504 is further coupled to mode control 160. The FRLT 124 employs a capacitor-charging technique to provide a receiver detect functionality for supporting the PCI standard. In one embodiment, resistance of the adjustable termination resistance circuit 130 is set and the corresponding capacitive response is measured to determine whether a downstream receiver exists: if a downstream receiver does exist, communications may begin.

In order to determine whether a downstream receiver exists, the mode control 160 sets the transmitter 126 to off and the termination resistance circuit 130 rail voltage (i.e., from the variable voltage 132) to a high rail, e.g., 3.3V. The output of the Schmitt trigger 504 drives a counter in the core 116 and toggles the supply voltage attached to the termination resistance 130 from a variable voltage to 0 v and back (i.e., variable voltage 132 to 0V). A capacitance external to the PHY 102 (e.g., the capacitance of a cable coupled to the PHY 102) may be represented by external capacitance 502 coupled to the FRLT 124 via the differential interface 110. The external capacitance 502 varies depending on whether an external receiver is coupled to the PHY 102. If a downstream receiver is coupled to the PHY 102, the external capacitance 502 may represent a capacitor between 50 nF-200 nF for capacitive coupling from the downstream receiver to the PHY 102, as required by the PCIe standard; if there is no downstream receiver coupled to the PHY 102, the external capacitor 502 may represent a parasitic capacitance on the order of a few picofarads (pF).

The external capacitance 502 charges at a rate dictated by the size of the external capacitance 502 and the termination resistance of the adjustable termination resistance circuit 130, causing the voltage at the input of the Schmitt trigger 504 to increase at the same rate. When the Schmitt trigger input voltage exceeds a high-threshold value, for example 2.8 V, the Schmitt trigger 504 generates a first output that toggles the termination resistance circuit rail voltage to an opposite rail, e.g., from high rail to ground rail. As a result of such a change in voltage, the external capacitance 502 discharges and the voltage at the input of the Schmitt trigger 504 decreases. When the Schmitt trigger voltage falls below a low threshold, for example, 0.5V, the Schmitt trigger 504 generates a second output that toggles the termination resistance circuit rail voltage, e.g., from ground rail back to high rail, causing the Schmitt trigger input voltage to once again rise. The combination of termination resistance of the termination resistance circuit 130 with the external capacitance 502 sets the rise/fall time (i.e., set by an RC time constant determined by the adjustable termination resistance circuit 130 and the size of the external capacitance 502) to charge the external capacitance 502 and hence determines the oscillation frequency of loop.

The termination resistance of the adjustable termination resistance circuit 130 may be set to move the two oscillation frequencies for the two capacitance conditions (i.e., downstream receiver or no downstream receiver) to predetermined criteria. For example, the adjustable termination resistance circuit 130 may be set from a very low transmit termination resistance (e.g., a few ohms) to as high as a few hundred ohms. The adjustable termination resistance circuit setting may be determined by measuring the output frequency at the differential interface 110 using a scope and then, once the correct value of resistance required to obtain the correct frequency is determined, the adjustable termination resistance circuit 130 may be manually set from the mode control 160. In some embodiments, the adjustable termination resistance circuit 130 may be set such that a frequency<1 MHz indicates that a downstream receiver is attached, and a frequency>1 MHz indicates that no downstream receiver is attached. The signal output from the Schmitt trigger 504 drives a counter in the core 116; the rate at which the counter overflows relative to the reference clock then determines the frequency. Once a downstream receiver has been detected, the core 116 writes to the mode control 160 which turns on the transmitter 126 and its drive level is set appropriately.

In order to minimize the capacitance of the FRLT 124 with respect to the differential interface 110, a first stage gate sizing as small as possible is utilized.

Figure 8:
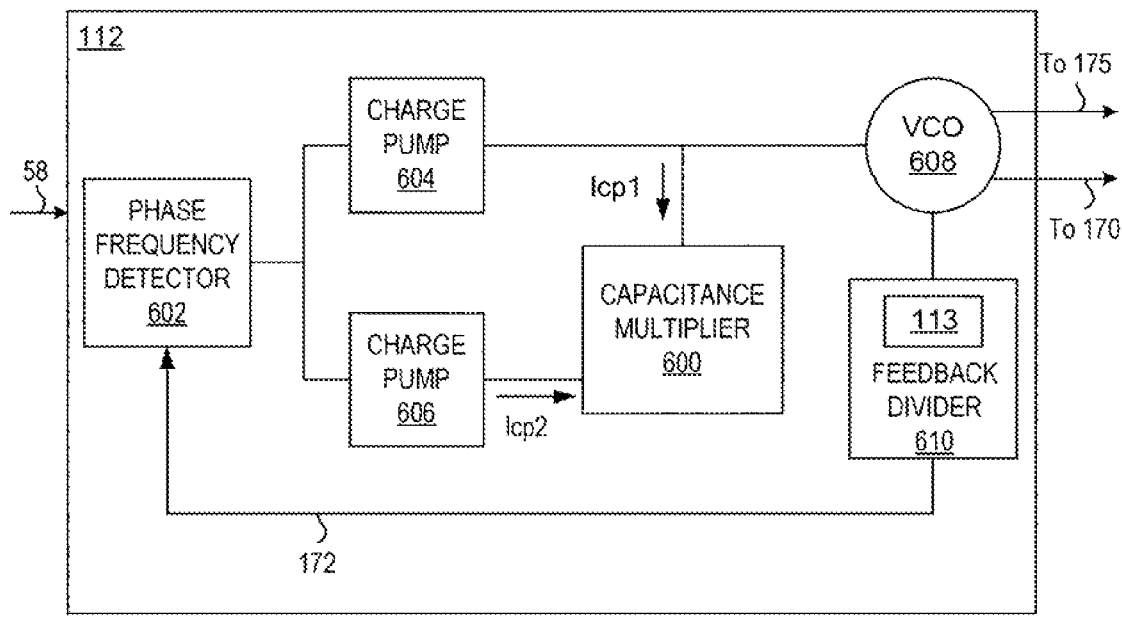
FIG. 8 is a block diagram of a clock synthesis unit (CSU) comprising a capacitance multiplier and multi-modulus divider in accordance with one or more embodiments of the present invention.

FIG. 8 is a block diagram of a CSU 112 comprising a capacitance multiplier 600 in accordance with one or more embodiments of the present invention. The CSU 112 comprises a phase frequency detector 602, charge pumps 604 and 606, a voltage controlled oscillator (VCO) 608, a feedback divider 610, and the capacitance multiplier 600, acting together as a phase lock loop (PLL) (also referred to as a clock synthesis control loop). The phase frequency detector 602 is coupled to a feedback divider 610 and to charge pumps 604 and 606. An output from the charge pump 604 is coupled to both the VCO 608 and a terminal "a" of the capacitance multiplier 600, and an output from the charge pump 606 is coupled to a terminal "b" of the capacitance multiplier 600. A current Icp1 flows into the terminal "a" of the capacitance multiplier 600, and a current Icp2 flows toward the terminal "b". The VCO 608 is also coupled to the feedback divider 610, the SIPO/PISO 175, and the DCRU 170. The phase frequency detector 602 receives a reference clock input from clock source 58, and the CSU 112 multiplies the received reference clock by the appropriate ratio as set by feedback divider 610 to obtain the necessary clock signal for the SIPO/PISO 175 and the ECRU 170.

Figure 20:
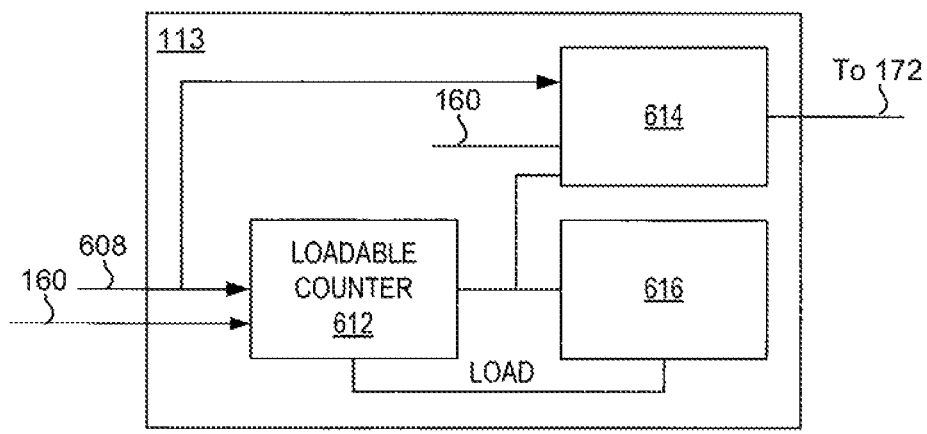
FIG. 20 is a block diagram of a multi-modulus divider in accordance with one or more embodiments of the present invention.

The CSU 112 comprises a multi-modulus divider 113 shown in FIG. 20, which is part of the feedback divider module 610. Dividers are a key component in any phase lock loop (PLL) and divide the frequency of an incoming clock signal by any integer amount. In the PHY 102, the multi-modulus divider 113 is a programmable divider where the divisor controls the multiplication factor of the PLL and output clock of the PLL, which is essential for the PHY 102 to support the different operation frequencies associated with different protocols such as 2.7 GHz for DisplayPort and 2.5 GHz for PCIe. For example, setting the multi-modulus divider 113 to a divisor of 25 and supplying a reference clock of 100 MHz to the PLL results in the PLL generating a 2500 MHz output clock, which would be appropriate for PCIe applications. Effectively, the reference clock has been multiplied by 25—i.e., the value as the feedback divisor. If the divisor is changed to 27, the PLL's output would change to 2700 MHz which would be appropriate for DisplayPort applications. Depending on the protocol the PHY 102 is configured for, the divisor is adjusted by the core 116 via mode control 160 to ensure that the PLL generates a clock that is compatible with the protocol. The multi-modulus divider 113 may be programmed while in operation to any value as needed for the PHY 102 to support a particular protocol.

One embodiment of the capacitance multiplier 600 is described below with respect to FIG. 9; another embodiment of capacitance multiplier 600 is described below with respect to FIG. 19.

The output clock from the VCO 608 then drives both the SIPO/PISO 175 and DCRU 170.

Figure 9:
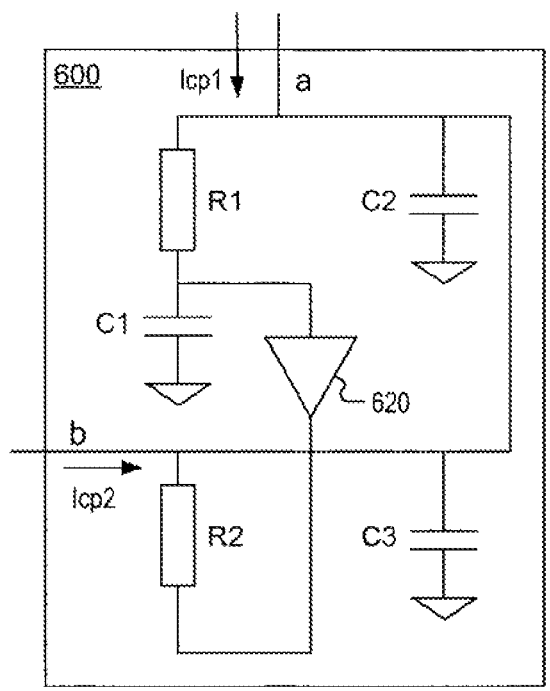
FIG. 9 is a block diagram of an alternative embodiment of a capacitance multiplier in accordance with one or more embodiments of the present invention.

FIG. 9 is a block diagram of an embodiment of a capacitance multiplier 600 in accordance with one or more embodiments of the present invention. As depicted in FIG. 9, the capacitance multiplier 600 comprises resistors R1, R2, and capacitors C1 C2 and C3. The resistor R1 and the capacitor C1 are coupled in series; a first terminal of the resistor R1 is coupled to the terminal "a" of the capacitance multiplier 600, and a first terminal of the capacitor C1 is coupled to ground. The capacitor C2 is coupled between the output of charge pump 604 and ground. An operational amplifier 620 is configured as a voltage follower and has its input coupled to a second terminal of the resistor R1. The resistor R2 is coupled between the output of the operational amplifier 620 and the terminal "b" of the capacitance multiplier 600, and the capacitor C3 is coupled between the terminal "b" of the capacitance multiplier 600 and ground. The output from the charge pump 606 is coupled to the VCO 608. A current Icp1 flows into the capacitance multiplier terminal "a", and a current Icp2 flows into the capacitance multiplier terminal "b".

R1, C1 form a standard analog CSU loop Zero Capacitor. The configuration of the capacitance multiplier as depicted in FIG. 9 allows the capacitance multiplier 600 to operate over 20-times by changing the multiplying factor from a ratio of charge pump currents to the difference of charge pump currents thus allowing for a bigger range on m, where m is equal to the difference between Icp1 and Icp2.

The topology of the capacitance multiplier 600 allows a lour frequency zero to be added to the PLL without using a very large capacitor.

Figure 10:
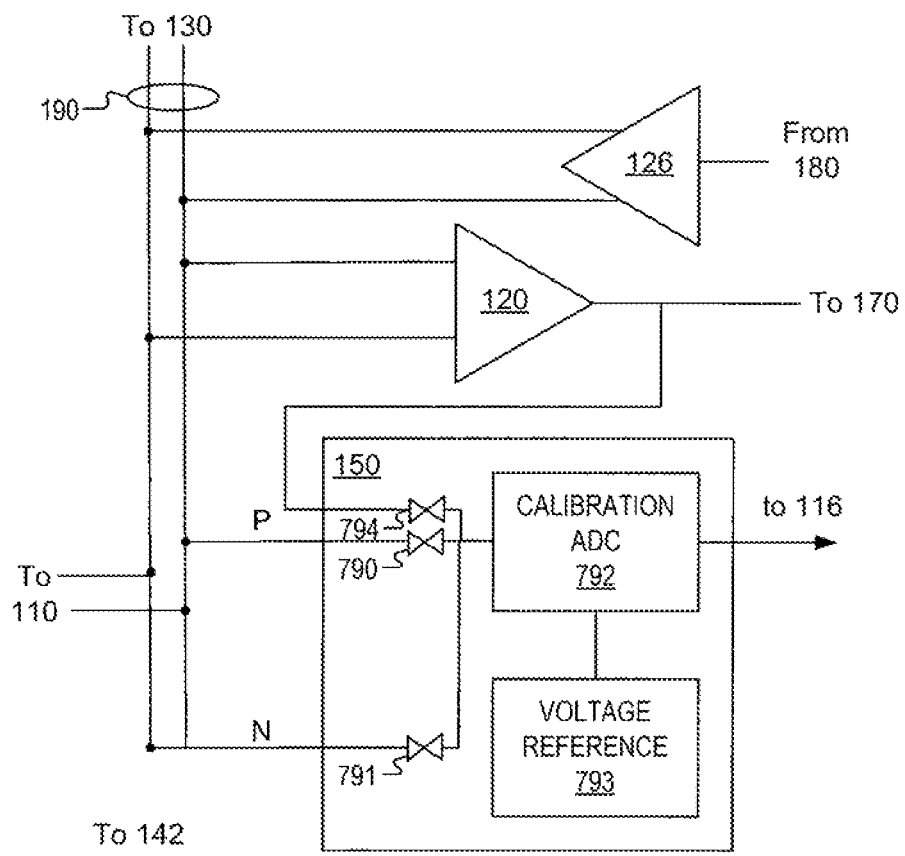
FIG. 10 is a block diagram of a calibration circuit 150 in accordance with one or more embodiments of the present invention.

FIG. 10 is a block diagram of a calibration circuit 150 in accordance with one or more embodiments of the present invention. The calibration circuit 150 comprises switches 790, 791, and 794, calibration analog-to-digital converter (ADC) 792 (referred to as "ADC 792"), and voltage reference 793. The ADC 792 is coupled to a first line P of the bus 190 through the switch 790, to a second line N of the bus 190 through the switch 791, and to the output from the receiver 120 through the switch 794. The ADC 792 is further coupled to the voltage reference 793, and an output of the ADC 792 is coupled to core 116.

The switches 790 and 791 are thick oxide switches to allow for measuring either P or N, which can have a wide common mode range. The ADC 792 may be of any configuration that allows sufficient accuracy to resolve the termination resistance, drive levels and pre-emphasis levels to an acceptable value. For example, for tuning of drive levels that requires resolution on the order of around 25 mV, the ADC 792 may be a 10-bit ADC or have a 1mV step size so as not to limit the tuning of the drive levels. In some embodiments, accuracy on the adjustable termination resistance circuit is 5%, and drive level is 20 mV for each measurement. The ADC 792 measures a plurality of different voltage reference values, and stores these ADC codes. When the transmitter driver is swept, it is compared and calibrated to the voltage reference values as described below with respect to the method 1500.

The switch 794 is allows the receiver output to be measured as an eye plot by using the ADC 792. Analogous to the transmitter eye, method 1700 is used. When switch 794 is on, switches 790 and 791 are off (i.e., only one switch is on at a time for the ADC 792 to measure). The purpose of this measurement is to attach the downstream transmitter and cable to PHY 102. During link training, the calibration circuit 150 can measure the eye and optimize the combined transmitter pre-emphasis and receiver equalization settings to obtain the best eye which meets the eye template for the specification.

The calibration circuit 159 enables four calibrations to be done with one circuit through four different methods. More specifically, calibration circuit 150 enables the methods 1400, 1500, 1600 and 1700 described below for calibrating a PHY 102 to one of a PCIe, DVI, DP or HDMI input standard or to one of a PCIe, DVI, DP, HDMI or VGA output standard.

Figure 11:
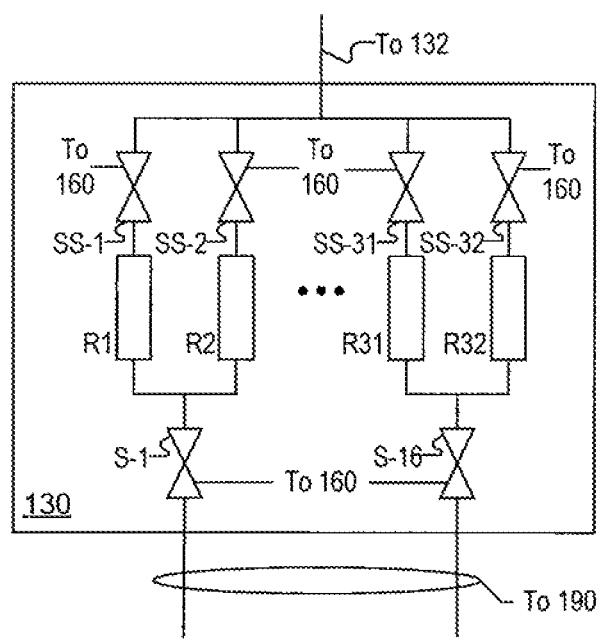
FIG. 11 is a block diagram of a termination resistance circuit in accordance with one or more embodiments of the present invention.

FIG. 11 is a block diagram of a termination resistance circuit 130 in accordance with one or more embodiments of the present invention. In one embodiment, the resistance circuit 130 comprises thirty-two 850 Ohm resistors in parallel from which zero to thirty-two of these 850 Ohm resistors may be selected.

The termination resistance circuit 130 comprises a plurality of resistors R-1, R-2 . . . , R-31, and R-32 (i.e., a total of thirty-two resistors R), collectively referred to as resistors R, coupled in parallel between the variable voltage 132 and the bus 190 via a plurality of switches S-1, S-2, . . . S-16 (collectively referred to as switches S), and sub-switches SS-1, SS-2, . . . SS-32 (collectively referred to as sub-switches SS), where the switches S and sub-switches SS are configured as pass gates. A first terminal of each resistor R is coupled to a different sub-switch SS in a one-to-one correspondence (i.e., R-1 is coupled to SS-1, R-2 is coupled to SS-2, . . . R-32 is coupled to SS-32), and each sub-switch SS is further coupled to the variable voltage module 132. At their second terminals, the resistors R are coupled in pairs to each of the switches S (i.e., R-1 and R-2 are coupled to S-1; R-3 and R-4 are coupled to S-2; . . . , and R-31 and R-32 are coupled to S-16). The switches S are all further coupled to the bus 190. Additionally, all of the switches S and sub-switches SS are coupled to the mode control 160 for operative control. By activating/deactivating the appropriate switches, a desired number of resistors R may be activated in parallel between the variable voltage 132 and the bus 190 to achieve the desired termination resistance for the PHY 102 (e.g., 50 ohms). One embodiment of a method for setting the desired number of resistors R is described with respect to the method 1400.

In some embodiments, each of the resistors R is an 850 ohm resistor, although for thirty-two resistors any value for R on the order of 500 ohms to 1 kilo ohm would result in a reasonable range around 50 ohms within reasonable tolerance. To support the large common mode range and rail range, the switches S and sub-switches SS should be made from thick oxide devices; in some embodiments, the switches S and sub-switches SS are NMOS pass gates.

Figure 12:
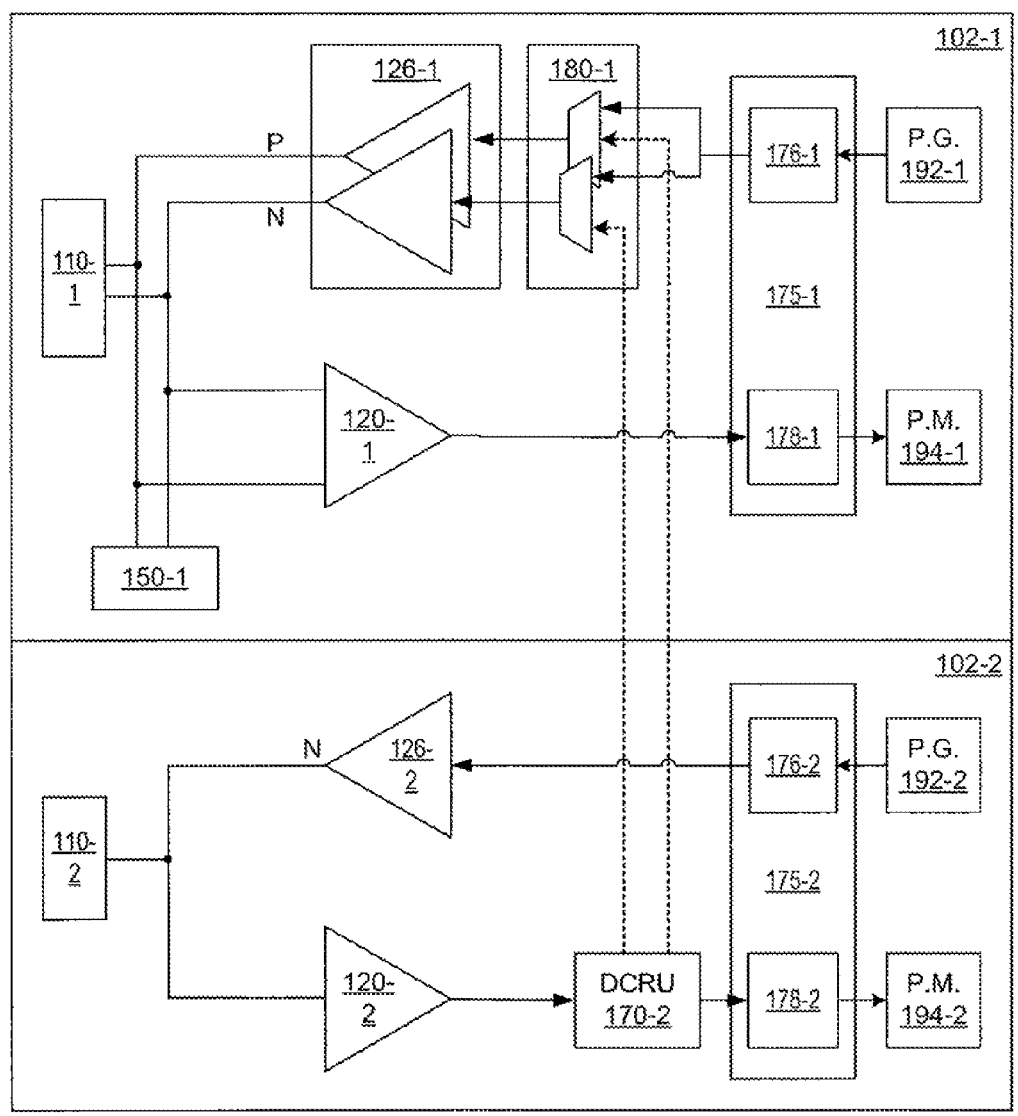
FIG. 12 is a block diagram depicting one embodiment of a plurality of PHYs 102 configured for performing a diagnostic check of recovered clock and data.

FIG. 12 is a block diagram depicting one embodiment of a plurality of PHYs 102 configured for performing a diagnostic check of recovered clock and data signals. The plurality of PHYs 102 comprises a first PHY 102-1 and a second PHY 102-2, which may be any two adjacent PHY circuits. Both PHYs 102-1 and 102-2 comprise the components as configured within the PHY 102 of FIG. 3; for simplicity, a subset of components of the PHYs 102-1 and 102-2 are depicted in FIG. 12.

In the embodiment depicted in FIG. 12, the PHY 102-2 receives a serial data stream at the receiver 120-2 via the differential interface 110-2. The received data is coupled from the output of the receiver 120-2 to the DCRU 170-2, and is further coupled, unaltered, from the DCRU 170-2 to the input of the multiplexer 180-1 in the PHY 102-1. The DCRU 170-2 generates a clock off of the data from the receiver 120-2 and couples the generated clock to the multiplexer 180-1. In the depicted diagnostic mode, the multiplexer 180-1 selects the DCRU clock and the data from the receiver 120-2. The data received at receiver 120-2 and the recovered clock may thus be recorded on the calibration circuit 150-1 of the PHY 102-1 to verify correct operation of this block and/or fed out to a scope coupled to the differential interface 110-1 for performing a diagnostic check of where the DCRU recovered clock is centered relative to the data eye.

FIG. 13 is a functional block diagram 1300 of an interface between silicon die 1310 and silicon package 1320, including shared package balls 1302 and silicon bumps or pads 1304 of a differential interface 110 in accordance with one or more embodiments of the present invention. The differential interface 110 comprises first and second package balls 1302-1 and 1302-2, collectively referred to as package balls 1302, and first and second silicon bumps or pads 1304-1 and 1304-2, collectively referred to as silicon bumps/pads 1304. The first package ball 1302-1 is coupled to the first silicon bump/pad 1304-1 by a first package trace 1306-1, and the second package ball 1302-2 is coupled to the second silicon bump/pad 1304-2 by a second package trace 1306-2. The first silicon bump/pad 1304-1 is coupled to the P line of the bus 190, providing connectivity for P output of the transmitter module 126 and the input of the receiver module 120; the second silicon bump/pad 1304-2 is coupled the N line of the bus 190, providing connectivity for the N output of the transmitter module 126 and the input of the receiver module 120. The bus 190 is coupled to additional circuits as depicted in FIG. 3.

By having the transmitter module 126 and the receiver module 120 share a common differential interface bump/pad/trace/bail for each P and N as shown in FIG. 13, the PHY 102 will have a smaller die area.

Figure 14:
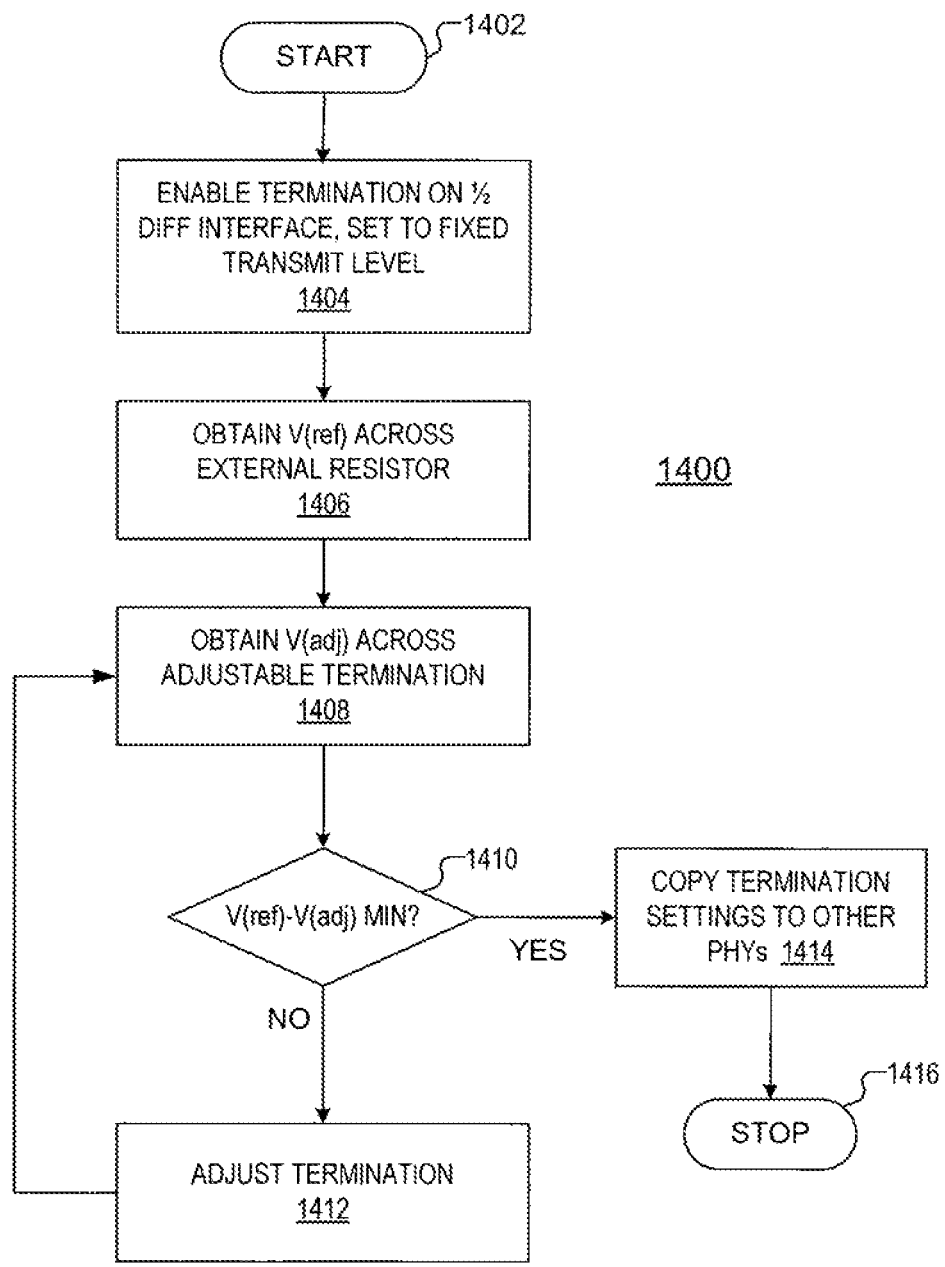
FIG. 14 is a flow diagram of a method for termination resistance calibration in accordance with one or more embodiments of the present invention.

FIG. 14 is a flow diagram of a method 1400 for calibration of the termination resistance circuit 130 in accordance with one or more embodiments of the present invention. The method 1400 calibrates the adjustable termination resistance circuit 130 by searching for a global minimum in the difference between voltages across an external resistor and the adjustable termination resistance circuit 130 by adjusting across the entire termination range. The method 1400 is performed on a single PHY 102 and the resultant setting is then programmed into all remaining PHY 102s associated with the current operating mode.

The method 1400 begins at step 1402 and proceeds to step 1404. At step 1404, the termination resistance of the adjustable termination resistance circuit 130 is enabled on half of the differential interface 110 (i.e., either the P or N node) of a PHY 102 and set to a fixed transmit level as controlled by the core 116 via mode control 160. At step 1406, a reference voltage V(ref) is measured across an external resistor coupled to the differential interface 110. The external resistor is generally an accurate 0.1% to 1% 50 ohm resistor.

At step 1408, a voltage V(adj) is measured across the adjustable termination resistance circuit 130. At step 1410, a determination is made whether the difference V(ref)-V(adj) is minimized. If the result of such determination at step 1410 is no, the method 1400 proceeds to step 1412 where the termination resistance is adjusted to another value and the method 1400 the returns to step 1408. Adjusting the termination changes V(adj) in a monotonic fashion; i.e., increasing the termination in ohms results in a V(adj) increase. If, at step 1412, the result of the determination is yes, the global minimum in the difference between the two voltages has been determined; i.e., the difference between V(ref) and V(adj) is determined as minimized if the last difference was larger. The method 1400 proceeds to step 1414 where the corresponding termination setting is copied to the remaining PHYs 102 associated with the current operating mode. The method 1400 then proceeds to step 1416 where it ends.

Figure 15:
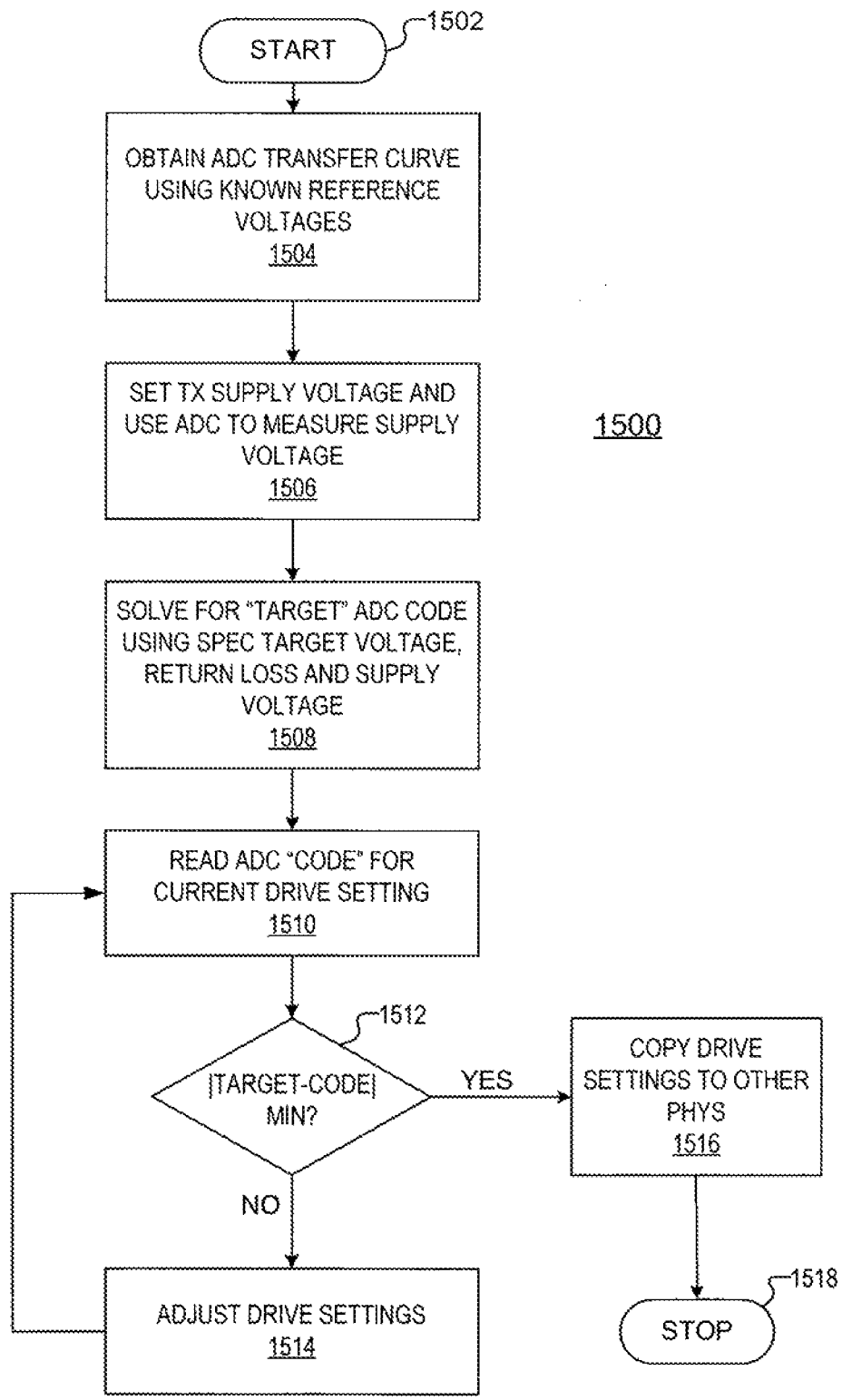
FIG. 15 is a flow diagram of a method for drive level calibration in accordance with one or more embodiments of the present invention.

FIG. 15 is a flow diagram of a method 1500 for drive level calibration in accordance with one or more embodiments of the present invention. The method 1500 comprises performing a transmit level search; this can be achieved on the actual PCIe lanes in the instance of a PCIe configuration, during which the PHY 102 is typically attached to a PCIe motherboard at the time of drive level calibration. This is unlike a typical DisplayPort, DVI or other video port calibration in which a display apparatus may not be connected to the PHY 102 at the time of calibration. In another embodiment PCIe lanes may also be calibrated using calibration circuit 150 on PHY 102. The method 1500 begins at step 1502 and proceeds to step 1504. At step 1504, the ADC transfer curve for the calibration ADC 792 is determined against multiple known voltage references. At step 1506, the configurable supply voltage (404) is set and measured for PHY 102. When driving a DC-coupled interface such as DVI, the monitor side 3.3V is measured; when driving an AC-coupled interface such as PCIe/DP, supply 404 is measured.

At step 1508, a "Target" ADC code is solved using the supply voltage and relevant drive specification for the standard currently being supported. At step 1510, the ADC "Code" is checked for the current drive settings. At step 1512, a determination is made whether the absolute difference |Target−Code| is minimized. If the result of such determination at step 1512 is no, the method 1500 proceeds to step 1514 where the drive settings are adjusted by adjusting 402, 406, and 408 to another value and the method 1500 then returns to step 1510. If, at step 1512, the result of the determination is yes, the method 1500 proceeds to step 1516 where the corresponding drive settings are copied to the remaining PHYs 102 associated with the current operating mode. The method 1500 then proceeds to step 1518 where it ends. The method 1500 is repeated for each drive level required by the standard being supported (e.g., DP has 4 required drive levels) and a look up table of settings for 402, 404, 406, 408 is generated.

FIG. 16 is a flow diagram of a method 1600 for calibrating the pre-emphasis or de-emphases levels in accordance with one or more embodiments of the present invention. The method 1600 searches for a global minimum in the difference between a target ADC code and an ADC code for the current drive level by adjusting across the entire drive and pre-emphasis/de-emphasis range.

For PCIe/DP, the configuration of connected cables and/or printed circuit board (PCB) components may dictate the requirement to use pre-emphasis (DP) or de-emphasis (PCIe). For DP pre-emphasis, the peak-to-peak transmit level must be pre-adjusted before performing transmission level calibration as shown in method 1500 described above. The transmitter in the PHY 102 is generally enabled with de-emphasis capability only.

The pre-emphasis level can be calibrated both with and without a downstream receiver attached. In general, the pre-emphasis level is calibrated without a downstream receiver attached such that during protocol negotiation a known amount of pre-emphasis can be negotiated for the channel media. The method 1600 begins at step 1602 and proceeds to step 1604. At step 1604, load supply voltage and ADC transfer curve data for the calibration ADC 792 (determined in steps 1504 and 1506 of the method 1500) are loaded. At step 1606, the transmitter output single-ended peak-to-peak drive voltage VPP is measured. At step 1608, a "Target" ADC code is determined using the measured VPP and the pre-emphases/de-emphasis requirements in the relevant specification for the standard currently being supported. At step 1610, the ADC code for current drive and pre-emphasis/de-emphasis settings is read. At step 1612, a determination is made whether the absolute difference between the "Target" ADC code and the "Code" ADC code read at step 1610 is minimized. If the result of such determination is no, the method 1600 proceeds to step 1614 where integer and fractional pre-emphases/de-emphasis settings are adjusted, by adjusting 402. The method 1600 then returns to step 1610. If, at step 1612, the result of the determination is yes, the global minimum has been determined: i.e., since the transmitter drive and pre-emphasis/de-emphasis behavior is monotonic, once a current result of the difference |Target−Code| is smaller than the previous result, the global minimum has been determined. The method 1600 proceeds to step 1616 where the pre-emphasis/de-emphasis setting is copied to other PHYs 102. The method 1600 then proceeds to step 1618 where it ends.

FIG. 17 is a flow diagram of a method 1700 of data eye calibration in accordance with one or more embodiments of the present invention. For measuring the data eye of the transmitter module 126, the method 1700 is performed once the PHY 102 is connected to an external receiver via a cable. For measuring the data eye of the receiver module 120, the method 1700 is performed once the PHY 102 is connected to an external transmitter.

The method 1700 begins at step 1702. For measuring the data eye of the transmitter module 126, the method 1700 proceeds to step 1703. At step 1703, a step of a phase interpolator (PI) within the DCRU 170 is set to zero, and a periodic pattern is transmitted from the pattern generator 192 to the transmitter module 126 via the serializer 176 of the SIPO/PISO 175.

For measuring the data eye of the receiver module 120, the method 1700 proceeds from step 1702 to step 1704. At step 1704, a step of the PI within the DCRU 170 is set to zero, and the incoming data pattern is received through the receiver module 120 (i.e., either via receiver 302, 304 or 350). The PI adjusts the ADC clock and hence moves the sample point through the data eye.

At step 1706, the calibration ADC 792 samples the interface voltage at sub-data rates. At step 1708, the samples obtained at step 1706 are averaged. At step 1710, a determination is made whether the ADC conversion is complete. If the result of such determination is no, the method 1700 returns to step 1708. The number of averages that may be obtained is dependent on the ADC resolution, chip noise, and speed at which the data eye must be traced out; in some embodiments, the number of averages that may be obtained is on the order of one-thousand.

If the result of the determination at step 1710 is yes, the method 1700 proceeds to step 1712. At step 1712, a determination is made whether the PI has swept over its full range. If the result of such determination is no, the method 1700 proceeds to step 1714 where the PI is incremented one step. In some embodiments, such as the embodiment described herein, a resolution of the PI of 32, 64 or 128 phase steps per unit interval (UI) is utilized, although in other embodiments other phase step resolutions are possible. The PI adjusts the phase of clock from the CSU 112 feeding the ADC 792 and thus the phase of clock sampling the incoming data from transmitter 126 or receiver 120

If the result of the determination at step 1712 is yes, the method 1700 proceeds to step 1716. As a result of repeating the previous steps for each phase step, the entire data eye is swept out. In some embodiments, the current PI has a fixed 44-phase steps to transverse one full period (360 degrees). For example, for a 2.7 Gbits/sec (DP upper data rate) each phase step is (1/2.7G)/44=8.5 ps resolution.

At step 1716, the data eye is generated using the ADC conversions. The method 1700 proceeds to step 1718 where it ends. The method 1700 is repeated for each PHY 102.

Figure 18:
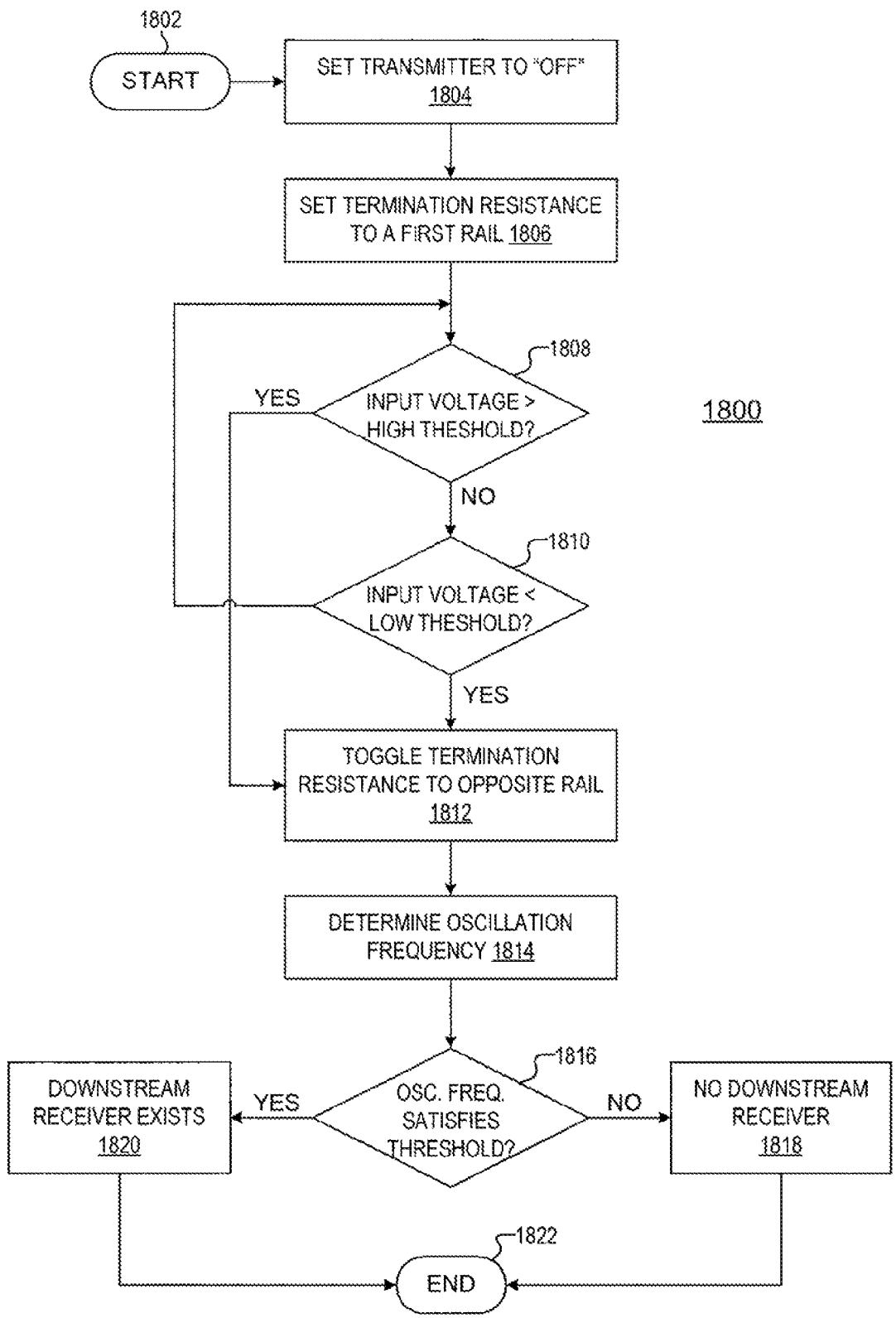
FIG. 18 is a flow diagram of a method for determining whether a downstream receiver is coupled to the PHY in accordance with one or more embodiments of the present invention.

FIG. 18 is a flow diagram of a method 1800 for determining whether a downstream receiver is coupled to the PHY 102 in accordance with one or more embodiments of the present invention. The method 1800 utilizes a capacitor-charging technique to determine whether a downstream receiver is coupled to the PHY 102; such downstream receiver detect functionality supports the PCI standard. In one embodiment, resistance of the adjustable termination resistance circuit 130 is set and the corresponding capacitive response is measured to determine whether a downstream receiver exists; if a downstream receiver does exist, communications may begin.

The method 1800 begins at step 1802 and proceeds to step 1804. At step 1804, the transmitter 126 is set to "off" by the mode control 160. At step 1806, the termination resistance circuit 130 rail voltage (i.e., from the variable voltage 132) is set to a first rail, e.g., a high rail of 3.3V, by the mode control 160. A capacitance external to the PHY 102 varies depending on whether or not an external receiver is coupled to the PHY 102. If a downstream receiver is coupled to the PHY 102, the external capacitance (e.g., the capacitance of a cable coupled to the PHY 102) may be between 50 nF-200 nF; if there is no downstream receiver coupled to the PHY 102, the external capacitance may be a parasitic capacitance on the order of a few pF.

The voltage at the input of the Schmitt trigger 504 increases at the same rate as the external capacitance charges, which is dictated by the size of the external capacitance and the termination resistance. The output of the Schmitt trigger 504 drives a counter in the core 116 and toggles the polarity of termination resistance 130 (i.e., variable voltage 132 or 0V) based on the Schmitt trigger input voltage. At step 1808, a determination is made whether the Schmitt trigger input voltage exceeds a high threshold, such as 2.8V. If the result of the determination is yes, the method 1800 proceeds to step 1812; if the result of the determination is no, the method 1800 proceeds to step 1810. At step 1810, a determination is made whether the Schmitt trigger input voltage is less than a low threshold. If the result of the determination is no, the method 1800 returns to step 1808; if the result of the determination is yes, the method 1800 proceeds to step 1812.

At step 1812, i.e., when the Schmitt trigger input voltage either exceeds the high threshold or is less than the low threshold, the Schmitt trigger output causes the termination resistance circuit rail voltage to toggle to an opposite rail, resulting in the charging/discharging of the external capacitance. The combination of termination resistance of the termination resistance circuit 130 with the external capacitance sets the rise/fall time (i.e., set by an RC time constant determined by the adjustable termination resistance circuit 130 and the size of the external capacitance) to charge the external capacitance and hence determines the oscillation frequency of loop. As can be appreciated by one skilled in the art, the steps 1808 through 1812 may be repeated numerous times.

At step 1814, the oscillation frequency is determined. The signal output from the Schmitt trigger 504 drives a counter in the core 116; the rate at which the counter overflows relative to the reference clock then determines the frequency. At step 1816, a determination is made whether the oscillation frequency satisfies a threshold. If the result of the determination at step 1816 is no, that the oscillation frequency does not satisfy the threshold, the method 1800 proceeds to step 1818 where it is determined that no downstream receiver is attached to the PHY 102. If the result of the determination at step 1816 is yes, that the oscillation frequency does satisfy the threshold, the method 1800 proceeds to step 1820 where it is determined that a downstream receiver is attached to the PHY 102. In some embodiments, the adjustable termination resistance circuit 130 may be set (e.g., by measuring the output frequency at the differential interface 110 using a scope, determining a resistance value required to obtain a particular frequency, and setting the adjustable termination resistance circuit 130 from the mode control 160) such that an oscillation frequency <1 MHz indicates that a downstream receiver is attached, and an oscillation frequency >1 MHz indicates that no downstream receiver is attached.

At step 1820, once a downstream receiver has been detected, the core 116 writes to the mode control 160 which turns on the transmitter 126 and its drive level is set appropriately for communication with the downstream receiver.

The method 1800 proceeds for step 1820 or step 1818 to step 1822, where it ends.

Figure 19:
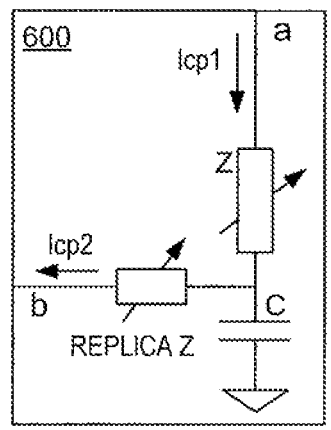
FIG. 19 is a block diagram of another embodiment of a capacitance multiplier in accordance with one or more embodiments of the present invention.

FIG. 19 is a block diagram of another embodiment of a capacitance multiplier 600 in accordance with one or more embodiments of the present invention. The capacitance multiplier 600 comprises a series combination of a variable impedance Z and a capacitor C. A first terminal of the variable impedance Z is coupled to the terminal "a" of the capacitance multiplier 600, and a first terminal of the capacitor C is coupled to ground. A second terminal of the variable impedance Z is coupled to the second terminal of the capacitor C. The capacitance multiplier 600 further comprises a replica impedance Z coupled between the terminal "b" of the capacitance multiplier 600 and a second terminal of the variable impedance Z. A current Icp2 flows from the replica impedance Z to the terminal "b" of the capacitance multiplier 600, and a current Icp1 flows into the variable impedance Z from the terminal "a" of the capacitance multiplier 600.

The capacitance multiplier 600 is an impedance-matched capacitance multiplier that improves the matching with the replica impedance Z on the return current path (i.e., current. Icp2) as depicted in FIG. 19. The loop filter effective capacitance is improved by the ratio of the currents (i.e., Icp1/Icp2, where Icp1 is a current flowing into the capacitance multiplier 600 at the terminal "a") and improves the multiplying factor from 2x (for no impedance matching) to 6x (for impedance matching). The capacitance multiplier 600 allows a smaller silicon area to be used to implement the loop zero.

FIG. 20 is a block diagram of a multi-modulus divider 113 in accordance with one or more embodiments of the present invention. The multi-modulus divider 113 a programmable fractional divider that comprises a loadable counter 612 (i.e., a synchronous loadable linear feedback shift register) that receives an input from mode control 160 and has an output coupled to both a pulse stretcher 614 and to a detect circuit 616; additionally, the loadable counter 612 receives an input from the VCO 608 that is also coupled to the pulse stretcher 614. The pulse stretcher 614 also receives a "pulse width select" input from mode control 160.

The loadable counter 612 is programmed to count to the desired divisor and release a flag to the pulse stretcher 614 after the desired divisor is achieved. Although any counter can be used for this application, in some embodiments the loaclable counter 612 may be a Synchronously Reloadable Linear Feedback Shift Register (SRLFSR) to provide highest operating frequency for all divisor values. The SRLFSR is a maximal length LFSR that can be reloaded into a user-determined state when the LFSR has reached a terminus or orphan state in its state transition diagram, as determined by the detect circuit 616 that is coupled to both the loadable counter 612 and the pulse stretcher 614. The number of states between the user-determined state and the terminus state determines the divisor value.

The pulse stretcher 614 elongates the flag from loadable counter 612 by several clock cycles to alleviate timing difficulties in downstream circuits (e.g., some circuits in the core 116 require both rising and falling edges; to simplify the timing requirements, the rising and falling edges must be equally spaced within one clock period. (i.e. the DCD Duty Cycle Distortion=50%) and also allows the flag to be delayed by a programmable amount as set by the mode control 160 (i.e., a "pulse width select" indication received from mode control 160). By delaying the flag, the divisor of the multi-modulus divider 113 is modified without reprogramming the counter. Delaying the flag by 1 clock cycle increases the overall divisor by 1. Delaying the flag by 4 clock cycles increases the overall divisor by 4. The ability to change divisor value and delay the flag in a true synchronous fashion during operation enables a fractional-N PLL architecture that can span nearly the entire divisor range.

FIG. 21 is a block diagram of a common mode isolation circuit 122 in accordance with one or more embodiments of the present invention. The common mode isolation circuit 122 comprises pass gates 2102 and 2104 (i.e., switches 2102 and 2104), and DC blocking capacitors 2106 and 2108 implemented as either metal-metal capacitor, a metal-oxide-metal capacitor, a metal-insulator-metal capacitor, or an active capacitor. In some embodiments, each of the DC blocking capacitors 2106 and 2108 may have a capacitance of 4 pF.

The pass gate 2102 is coupled between the differential interface 110 and a first terminal of the DC blocking capacitor 2106, and a second terminal the DC blocking capacitor 2106 is coupled to an first input of the receiver module 120. The pass gate 2104 is coupled between the differential interface 110 and a first terminal of the DC blocking capacitor 2108, and a second terminal the DC blocking capacitor 2108 is coupled to a second input of the receiver module 120. Gate terminals of the pass gates 2102 and 2104 are coupled to one another and also to the mode control 160.

When the PHY 102 is configured as a transmitter, the pass gates 2102 and 2104 are turned off via the mode control 160. With the pass gates 2102 and 2104 off, the switch capacitance that appears on the differential interface 110 is much lower than the DC blocking capacitor capacitance of the DC blocking capacitors 2106 and 2108, effectively reducing the capacitance that the receive node places on the differential interface 110.

While the foregoing is directed to embodiments of the present invention, other and further embodiments of the invention may be devised without departing from the basic scope thereof, and the scope thereof is determined by the claims that follow.

The invention claimed is:

1. An active capacitor multiplying circuit, comprising:
   a clock synthesis loop filter of at least second order, wherein the clock synthesis loop filter comprises a series combination of a first resistor and a first capacitor, and wherein the series combination of the first resistor and the first capacitor is coupled between a first charge pump interface and ground, and wherein the clock synthesis loop filter further comprises a second capacitor coupled between the first charge pump interface and the ground;
   a capacitor multiplying loop filter comprising a second capacitor coupled between a second charge pump interface and the ground, wherein the capacitor multiplying loop filter further comprises a second resistor coupled to the second charge pump interface and the second charge pump interface is coupled to the first charge pump interface; and an operational amplifier, driven by the first capacitor, for driving the second resistor, wherein a voltage presented at the first charge pump interface drives a voltage controlled oscillator (VCO).

2. The active capacitor multiplying circuit of claim 1, wherein capacitance of the first capacitor is magnified by a factor, wherein the factor comprises a difference between a first current across the first charge pump interface and a second current across the second charge pump interface.

3. The active capacitor multiplying circuit of claim 2 wherein the factor comprises a magnification value less than or equal to twenty.

4. The active capacitor multiplying circuit of claim 1, wherein the operational amplifier is configured as a follower amplifier.

5. The active capacitor multiplying circuit of claim 1 wherein the first capacitor and the second capacitor are either i) concurrently charging or ii) concurrently discharging.

\* \* \* \* \*